: US 7,203,229 B1
(12) United States Patent
Ishida et al.

(10) Patent No.: US 7,203,229 B1
(45) Date of Patent: Apr. 10, 2007

(54) APPARATUS FOR AND METHOD OF MEASURING JITTER

(75) Inventors: Masahiro Ishida, Tokyo (JP); Takahiro Yamaguchi, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 1017 days.

(21) Appl. No.: 09/882,290

(22) Filed: Jun. 14, 2001

(51) Int. Cl.
*H04B 17/00* (2006.01)
*G01R 13/02* (2006.01)

(52) U.S. Cl. .......................... 375/226; 702/69
(58) Field of Classification Search ................ 375/226, 375/371, 359, 360, 373, 227, 285, 375, 376; 324/612, 620, 76.77, 82, 622; 327/78, 155–156, 327/158–159, 161, 269; 702/69, 110, 79, 702/66, 125, 72; 370/516–519; 713/500–501, 713/503
See application file for complete search history.

(56) References Cited

U.S. PATENT DOCUMENTS

| 3,995,222 | A | * | 11/1976 | Mitarai ........................ 377/42 |
| 4,654,861 | A | * | 3/1987 | Godard ........................ 375/226 |
| 5,923,706 | A | * | 7/1999 | Marz ........................... 375/226 |
| 6,133,783 | A | * | 10/2000 | Stockman et al. ........... 327/554 |
| 6,208,169 | B1 | * | 3/2001 | Wong et al. .................... 326/93 |
| 6,240,130 | B1 | * | 5/2001 | Burns et al. ................. 375/226 |
| 6,291,979 | B1 | * | 9/2001 | Soma et al. ............. 324/76.82 |
| 6,400,129 | B1 | * | 6/2002 | Yamaguchi et al. ..... 324/76.82 |
| 6,460,001 | B1 | * | 10/2002 | Yamaguchi et al. .......... 702/69 |
| 6,522,122 | B2 | * | 2/2003 | Watanabe et al. ........ 324/76.77 |
| 6,525,523 | B1 | * | 2/2003 | Soma et al. ............. 324/76.77 |
| 6,687,629 | B1 | * | 2/2004 | Yamaguchi et al. .......... 702/69 |
| 6,775,321 | B1 | * | 8/2004 | Soma et al. ................. 375/226 |
| 6,795,496 | B1 | * | 9/2004 | Soma et al. ................. 375/226 |
| 2002/0103609 | A1 | * | 8/2002 | Kuyel .......................... 702/69 |
| 2002/0136337 | A1 | * | 9/2002 | Chatterjee et al. .......... 375/355 |
| 2002/0176491 | A1 | * | 11/2002 | Kleck et al. ................. 375/226 |
| 2003/0076181 | A1 | * | 4/2003 | Tabatabaei et al. ........... 331/57 |

OTHER PUBLICATIONS

Nelson Soo, PERICOM Application Brief AB36, "Jitter Measurement Techniques".*

* cited by examiner

*Primary Examiner*—Mohammed Ghayour
*Assistant Examiner*—Sophia Vlahos
(74) *Attorney, Agent, or Firm*—David N. Lathrop, Esq.; Gallagher & Lathrop

(57) ABSTRACT

A signal under measurement is band-limited, and frequency components around a fundamental frequency of the signal under measurement are extracted. Waveform data (approximated zero-crossing data) close to zero-crossing timings of the band-limited signal are sampled, and phase error data between the approximated zero-crossing points and the corresponding zero-crossing points of the signal under measurement are calculated from the approximated zero-crossing data to obtain a zero-crossing phase error data sequence $\delta[k]$. Then an instantaneous period sequence $T(k)$ of the signal under measurement is obtained from the zero-crossing phase error data and sampling intervals $T_{k,k+1}$ of the approximated zero-crossing data sequence. Then a period jitter sequence is obtained from differences between the $T(k)$ and a fundamental period $T_0$ of the signal under measurement, and then the period jitter sequence is multiplied by $T_0/T_{k,k+1}$ to correct the period jitter sequence.

31 Claims, 29 Drawing Sheets

PRIOR ART

PRIOR ART

PRIOR ART

PRIOR ART    Number of Events : 10,000
             RMS Jitter : 7.72 ps
             Peak-to-Peak Jitter : 48.2 ps PRIOR ART    Number of Events : 4,573
             RMS Jitter : 8.47 ps
             Peak-to-Peak Jitter : 52.0 ps

| Method | No. of Events | $J_{RMS}$ | $J_{PP}$ |
|---|---|---|---|
| Proposed Method Without Jitter Sequence Correction | 21,431 | 2.4535 ps (+0.53%) | 8.0029 ps (+15.9%) |
| Proposed Method with Jitter Sequence Correction | 21,431 | 2.4404 ps (-0.004%) | 6.9054 ps (+0.04%) |
| Ideal Value | -- | 2.4405 ps | 6.9028 ps |

| Method | No. of Events | $J_{RMS}$ | $J_{PP}$ |
|---|---|---|---|
| Time Interval Analyzer | 10,000 | 7.72 ps | 48.2 ps |
| Proposed Method | 4,696 | 7.49 ps | 45.7 ps |
| Difference | -53 % | -3.0 % | +1.5 % |

APPARATUS FOR AND METHOD OF MEASURING JITTER

BACKGROUND OF THE INVENTION

The present invention particularly relates to an apparatus for and a method of measuring period jitter that are applied to a measurement of jitter of, for example, a microprocessor clock or another periodic signal.

A time interval analyzer and/or an oscilloscope have conventionally been used for the measurement of period jitter. The method of these apparatus is called Zero-crossing Method, in which, as shown in FIG. 1, a clock signal (a signal under measurement) x(t) from, for example, a PLL (Phase-Locked Loop) under test 11 is supplied to a time interval analyzer 12. Regarding a signal under measurement x(t), a next rising edge following one rising edge fluctuates against the preceding rising edge as indicated by dotted lines. That is, a time interval $T_p$ between the two rising edges, namely a period fluctuates. In the Zero-crossing Method, a time interval between zero-crossings (period) of the signal under measurement is measured, and a fluctuation of period is measured by a histogram analysis. The histogram is displayed, for example as shown in FIG. 2, by the time interval analyzer 12. A time interval analyzer is described in, for example, "Phase Digitizing Sharpens Timing Measurements" by D. Chu, IEEE Spectrum, pp. 28–32, 1988, and "A Method of Serial Data Jitter Analysis Using One-Shot Time Interval Measurements" by J. Wilstrup, Proceedings of IEEE International Test Conference, pp. 819–823, 1998.

Tektronix, Inc. and LeCroy Co. have recently been providing digital oscilloscopes each being able to measure a jitter using an interpolation method. In this jitter measurement method using the interpolation method (interpolation-based jitter measurement method), an interval between data having signal values close to a zero-crossing out of measured data of a sampled signal under measurement is interpolated to estimate a timing of zero-crossing. That is, in order to estimate a fluctuation of period, a time interval between zero-crossings (period) is estimated using a data interpolation with a small error.

That is, as shown in FIG. 3, a signal under measurement x(t) from the PLL under test 11 is inputted to a digital oscilloscope 14. In the digital oscilloscope 14, as shown in FIG. 4, the inputted signal under measurement x(t) is converted into a digital data sequence by an analog-to-digital converter 15. A data-interpolation is applied to an interval between data having signal values close to a zero-crossing in the digital data sequence by an interpolator 16. With respect to the data-interpolated digital data sequence, a time interval between zero-crossings is measured by a period estimator 17. A histogram of the measured values is displayed by a histogram estimator 18. In addition, a root-mean-square value and a peak-to-peak value of fluctuations of the measured time intervals are obtained by an RMS & Peak-to-Peak Detector 19. For example, in the case in which a signal under measurement x(t) has a waveform shown in FIG. 5A, its period jitters are measured as shown in FIG. 5B.

On the other hand, inventors of the present invention have proposed a method of measuring a jitter as described below in an article entitled "Extraction of Peak-to-Peak and RMS Sinusoidal Jitter Using an Analytic Signal Method" by T. J. Yamaguchi, M. Soma, M. Ishida, and T. Ohmi, Proceedings of 18th IEEE VLSI Test Symposium, pp. 395–402, 2000. That is, as shown in FIG. 6, an analog clock waveform from a PLL (Phase locked loop) circuit under test 11 is converted into a digital clock signal $x_c(t)$ by an analog-to-digital converter 22, and the digital clock signal $x_c(t)$ is supplied to a Hilbert pair generator 23 acting as an analytic signal transforming part, where the digital clock signal $x_c(t)$ is transformed into an analytic signal $z_c(t)$.

In the Hilbert pair generator 23, signal components around a fundamental frequency of the clock signal under measurement $x_c(t)$ are extracted by a band-pass filter (not shown), and the extracted signal components are inputted to a Hilbert transformer 25, where the signal components are Hilbert-transformed. An analytic signal $z_c(t)$ having the signal component not Hilbert-transformed and the signal component Hilbert-transformed as a real part and an imaginary part of a complex number, respectively is obtained from the Hilbert pair generator 23.

An instantaneous phase $\Theta(t)$ of the clock signal $x_c(t)$ is estimated by an instantaneous phase estimator 26 from the analytic signal $z_c(t)$. A linear phase is removed by a linear phase remover 27 from this instantaneous phase $\Theta(t)$, and an instantaneous phase noise waveform $\Delta\phi(t)$ is obtained.

This instantaneous phase noise $\Delta\phi(t)$ is sampled by a zero-crossing sampler 28, and the sampled instantaneous phase noise is inputted to a peak-to-peak detector 32 as a timing jitter sequence $\Delta\phi[n]$, where a difference between the maximum peak value max ($\Delta\phi[k]$) and the minimum peak value min ($\Delta\phi[k]$) of the $\Delta\phi[n](=\Delta\phi(nT))$ is calculated to obtain a peak value (peak-to-peak value) $\Delta\phi_{pp}$ of timing jitter as follows.

$$\Delta\phi_{pp} = \max_k(\Delta\phi[k]) - \min_k(\Delta\phi[k])$$

In addition, the timing jitter sequence $\Delta\phi[n]$ is also inputted to a root-mean-square detector 33, where a root-mean-square (RMS) value of the timing jitter sequence $\Delta\phi[n]$ is calculated using following equation to obtain a root-mean-square value $\Delta\phi_{RMS}$ of timing jitter.

$$\Delta\phi_{RMS} = \sqrt{\frac{1}{N}\sum_{k=0}^{N-1}\Delta\phi^2[n]}$$

This method is referred to as the $\Delta\phi$ method, since a peak value of timing jitter (peak-to-peak value) and a root-mean-square value of timing jitter are obtained as described above from the instantaneous phase noise waveform $\Delta\phi(t)$.

According to the $\Delta\phi$ method, a timing jitter can be measured at high speed with relatively high accuracy.

Since the jitter measurement method in the time interval analyzer system includes an intermediate dead-time during which no measurement can be performed after each one of periodic measurements is performed, there is a problem that it takes a long time to acquire a number of data that are required for a histogram analysis.

In addition, in a jitter measurement method in which a wide-band oscilloscope and an interpolation method are combined, there is a problem that a jitter is overestimated (overestimation). That is, the measured jitter values in this method are not compatible with the values measured by the time interval analyzer method. For example, a jitter measurement result by the time interval analyzer and a jitter measurement result by the interpolation method for a 400 MHz clock signal are shown in FIGS. 7A and 7B, respectively so that those measurement results can be compared with each other. According to those figures, the measured value by the time interval analyzer is 7.72 ps (RMS), while the measured value by the interpolation method is 8.47 ps (RMS), and this value is overestimated. In addition, the jitter measurement method by the interpolation method requires a long measurement time.

In addition, in the conventional Δϕ method, a zero-crossing point of a signal under measurement is approximated by a sampling point closest to each zero-crossing point (this point is referred to as approximated zero-crossing points). Therefore, there is a possibility that an amount of error in jitter measurement is increased when an over-sampling rate in the signal digitization process is small.

It is an object of the present invention to provide a jitter measurement apparatus and its method that can estimate a jitter value compatible with a jitter value measured by the conventional time interval analyzer method.

SUMMARY OF THE INVENTION

The jitter measurement apparatus according to the present invention comprises: phase error estimation means for estimating sampling points close to corresponding zero-crossing points of the signal under measurement as approximated zero-crossing points, for obtaining phase errors between the approximated zero-crossing points and the corresponding zero-crossing points of the signal under measurement, and for outputting a zero crossing phase error data sequence; and a period jitter estimation means for obtaining a period jitter sequence of the signal under measurement from the phase error data sequence.

It is desirable that the jitter measurement apparatus according to the present invention further comprises: cycle-to-cycle period jitter estimation means to which the period jitter sequence is inputted for calculating its difference sequence, and for outputting a cycle-to-cycle period jitter sequence.

It is desirable that the jitter measurement apparatus according to the present invention further comprises: band-pass filter means for passing therethrough predetermined frequency components of the signal under measurement, and for supplying the predetermined frequency components to the phase error estimation means.

In addition, it is desirable that the jitter measurement apparatus according to the present invention further comprises: jitter detection means to which a jitter sequence is inputted for obtaining a jitter value of the signal under measurement from the jitter sequence.

It is desirable that the phase error estimation means comprises: zero-crossing sampling means to which the signal that has passed through the band-pass filter means is inputted for sampling only waveform data around zero-crossing timings of the band-limited signal, and for outputting an approximated zero-crossing data sequence; and phase error calculation means to which the approximated zero-crossing data sequence is inputted for calculating phase errors between the approximated zero-crossing points and the corresponding zero-crossing points of the signal under measurement from the approximated zero-crossing data, and for outputting the zero-crossing phase error data sequence.

It is desirable that the phase error estimation means further comprises: analytic signal transformation means to which the signal that has passed through the band-pass filter means is inputted for transforming the band-limited signal into a complex analytic signal, and for supplying the complex analytic signal to the zero-crossing sampling means.

It is desirable that the period jitter estimation means comprises: instantaneous period estimation means to which the zero-crossing phase error data sequence is inputted for obtaining an instantaneous period sequence of the signal under measurement from sampling intervals of the approximated zero-crossing data sequence and the zero-crossing phase error data; fundamental period subtraction means for obtaining differences between the instantaneous periods and a fundamental period of the signal under measurement, and for outputting an uncorrected period jitter sequence; and period jitter sequence correction means for multiplying the uncorrected period jitter sequence by a ratio of the fundamental period of the signal under measurement and the zero-crossing sampling intervals to perform a correction of the uncorrected period jitter sequence.

It is desirable that the period jitter estimation means comprises: instantaneous angular frequency estimation means to which the zero-crossing phase error data sequence is inputted for obtaining an instantaneous angular frequency sequence of the signal under measurement from the sampling intervals of the approximated zero-crossing data sequence and the zero-crossing phase error data; and period jitter calculation means for obtaining the period jitter sequence from the instantaneous angular frequency sequence and the fundamental period.

It is desirable that the band-pass filter means comprises: time domain to frequency domain transforming means for transforming the signal under measurement into a signal in frequency domain; bandwidth limitation means for extracting only components around the fundamental frequency of the signal under measurement from an output of the time domain to frequency domain transformation means; and frequency domain to time domain transformation means for inverse-transforming an output of the bandwidth limitation means into a signal in time domain.

The jitter detection means comprises one or a plurality of peak-to-peak detection means for obtaining a difference between the maximum value and the minimum value of a supplied jitter sequence, RMS detection means for obtaining a root-mean-square value (RMS value) of a supplied jitter sequence, and histogram estimation means for obtaining a histogram of a supplied jitter sequence.

The jitter measurement method according to the present invention comprises: a step of estimating sampling points close to corresponding zero-crossing points of the signal under measurement as approximated zero-crossing points, obtaining phase errors between the approximated zero-crossing points and the corresponding zero-crossing points of the signal under measurement, and estimating a zero-crossing phase error data sequence; and a step of obtaining a period jitter sequence of the signal under measurement from the phase error data sequence.

In addition, it is desirable that the jitter measurement method according to the present invention further comprises a step of calculating a difference sequence of the period jitter sequence to obtain a cycle-to-cycle period jitter sequence of the signal under measurement.

It is desirable that the jitter measurement method according to the present invention further comprises a step of passing predetermined frequency components of the signal under measurement to band-limit the signal under measurement, and moving to the step of estimating the zero-crossing phase error data sequence.

It is desirable that the jitter measurement method according to the present invention further comprises a step of obtaining a jitter value of the signal under measurement from a jitter sequence.

It is desirable that the step of estimating the phase error data sequence comprises: a step of sampling only waveform data close to zero-crossing timings of the band-limited signal, and estimating an approximated zero-crossing data sequence; and a step of calculating phase errors between the approximated zero-crossing points and the corresponding zero-crossing points of the signal under measurement from the approximated zero-crossing data sequence, and obtaining the zero-crossing phase error data sequence.

It is desirable that the step of estimating the phase error data sequence comprises: a step of transforming the band-limited signal into a complex analytic signal; a step of sampling the analytic signal waveform data close to zero-crossing timings of the transformed analytic signal to estimate an approximated zero-crossing complex data sequence; and a step of calculating phase errors between the approximated zero-crossing points and the corresponding zero-crossing points of the signal under measurement from the approximated zero-crossing complex data sequence, and obtaining the zero-crossing phase error data sequence.

It is desirable that the step of obtaining the period jitter sequence comprises: a step of obtaining an instantaneous period sequence of the signal under measurement from the sampling intervals of the approximated zero-crossing data sequence and the zero-crossing phase error data; a step of calculating differences between the instantaneous periods and the fundamental period of the signal under measurement, and obtaining an uncorrected period jitter sequence; and a step of multiplying the uncorrected period jitter sequence by a ratio of the fundamental period of the signal under measurement and the corresponding zero-crossing sampling intervals to correct the uncorrected period jitter sequence values.

It is desirable that the step of obtaining the period jitter sequence comprises: a step of obtaining an instantaneous angular frequency sequence of the signal under measurement from the sampling intervals of the approximated zero-crossing data sequence and the zero-crossing phase error data; and a step of obtaining a period jitter sequence from the instantaneous angular frequency sequence and the fundamental period.

It is desirable that the step of band-limiting the signal under measurement comprises: a step of storing the signal under measurement in a buffer memory; a step of extracting the signal in the sequential order from the buffer memory such that each partial signal being extracted is partially overlapped with the partial signal extracted just before; a step of multiplying each extracted partial signal by a window function; a step of transforming each partial signal multiplied by the window function into a spectrum signal in frequency domain; a step of extracting only components around the fundamental frequency of the signal under measurement from the spectrum signal; a step of inverse-transforming the spectrum signal having only the fundamental frequency component into a signal in time domain; and a step of multiplying the inverse-transformed signal in time domain by an inverse number of the window function to obtain the band-limited signal.

A principle of the present invention will be described below. In this description, a clock signal is used as a signal under measurement. However, the present invention can be applied to any periodic signal.

Jitter Measurement Method

A jitter-free clock signal is a square wave having a fundamental frequency $f_0$. This signal can be decomposed by Fourier analysis to harmonics having frequencies $f_0$, $3f_0$, $5f_0$, . . . . Since a jitter corresponds to a fluctuation of a fundamental frequency of a signal under measurement, only signal components around the fundamental frequency are handled in the jitter analysis.

A fundamental sinusoidal wave component x(t) of a jittery clock signal (clock signal under measurement) can be expressed, assuming that its amplitude is A and its fundamental period is $T_0$, by the following equation (1).

$$x(t) = A\cos(\phi(t)) = A\cos((2\pi/T_0)t + \theta - \Delta\phi(t)) \quad (1)$$

Here, $\phi(t)$ is an instantaneous phase of the signal under measurement, and can be expressed by a sum of a linear instantaneous phase component $2\pi t/T_0$ containing the fundamental period $T_0$, an initial phase angle component $\theta$, and an instantaneous phase noise component $\Delta\phi(t)$.

An analytic signal z(t) of a real signal x(t) is defined as a complex signal expressed by the following equation (2).

$$z(t) = x(t) + j\hat{x}(t) \quad (2)$$

In this case, j represents an imaginary unit, and an imaginary part $\hat{x}(t)$ of the complex signal z(t) is a Hilbert transform of a real part x(t).

On the other hand, the Hilbert transform of a time waveform x(t) is defined by the following equation (3).

$$\hat{x}(t) = H[x(t)] = \frac{1}{\pi}\int_{-\infty}^{+\infty}\frac{x(\tau)}{t-\tau}d\tau \quad (3)$$

In this case, $\hat{x}(t)$ is a convolution of the function x(t) and $(1/\pi t)$. That is, the Hilbert transform is equivalent to an output at the time when the x(t) is passed through an entire-band-pass filter. However, in the output $\hat{x}(t)$ in this case, the magnitude of its spectrum components has not been changed, but its phase has been shifted by $\pi/2$. Analytic signal and Hilbert transform are described in, for example, "Probability, Random Variables, and Stochastic Processes" by A. Papoulis, 2nd edition, McGraw-Hill Book Company, 1984.

Therefore, an analytic signal of a fundamental cosine wave x(t) of a signal under measurement is given by the following equation (4).

$$Z(t) = x(t) + j\hat{x}(t) = \quad (4)$$
$$A\cos((2\pi/T_0)t + \theta - \Delta\phi(t)) + jA\sin((2\pi/T_0)t + \theta - \Delta\phi(t))$$

An instantaneous frequency of the analytic signal z(t) is given, as is well known, by the following equation (5).

$$\frac{1}{T_0 + J} = \quad (5)$$
$$\frac{\omega(t)}{2\pi} = \frac{1}{2\pi}\frac{x(t)H'[x(t)] - x'(t)H[x(t)]}{x^2(t) + H^2[x(t)]} = \frac{1}{T_0}\left(1 - \frac{T_0}{2\pi}\Delta\phi'(t)\right) \text{ [Hz]}$$

That is, a period jitter J can be obtained by the following equation (7) from an equation (6).

$$T_0 + J(t) \approx T_0\left(1 + \frac{T_0}{2\pi}\Delta\phi'(t)\right) \text{ [sec]} \quad (6)$$

$$J(t) \approx \frac{T_0^2}{2\pi}\Delta\phi'(t) \text{ [sec]} \quad (7)$$

On the other hand, an instantaneous angular frequency $\omega(t)$ is given by the following equation (8).

$$\omega(t)=((2\pi/T_0)t+\theta-\Delta\phi(t))'=(2\pi/T_0)-\Delta\phi'(t)[\text{rad/sec}] \quad (8)$$

Therefore, from the equations (7) and (8), a period jitter J(t) can be expressed by the following equation (9) using an instantaneous angular frequency $\omega(t)$.

$$J(t)=(T_0^2/2\pi)\Delta\phi'(t)=(T_0^2/2\pi)((2\pi/T_0)-\omega(t))[\text{sec}] \quad (9)$$

As shown in FIG. (8), when adjacent rising zero-crossing points of a signal under measurement x(t) are approximated by corresponding sampling points t[k] and t[k+1] that are closest to the corresponding zero-crossing points $t_k$ and $t_{k+1}$, an instantaneous angular frequency $\omega(t)$ between the two adjacent approximated zero-crossing points [t[k], t[k+1]] is given by a ratio of a phase angle shifting during a time between t[k] and t[k+1] and a length of the time interval, assuming that a phase error between the approximated zero-crossing point t[k] and the real zero-crossing point $t_k$ is $\delta[k]$.

$$\omega[k]=\{(2\pi+(\delta[k+1]-\delta[k]))/T_{k,k+1}[\text{rad/sec}] \quad (10)$$

In this case, the $T_{k,k+1}$ represents the length of the time interval between the two adjacent approximated zero-crossing points t[k] and t[k+1], and can be obtained, as shown in FIG. 8, by obtaining a timing sequence t[k] of the approximated zero-crossing points and then calculating differences of the timing sequence t[k].

$$T_{k,k+1}=t[k+1]-t[k][\text{sec}] \quad (11)$$

In addition, a phase error $\delta[k]$ can be expressed by a difference between a phase angle $\phi(t[k])$ at an approximated zero-crossing point t[k] and a phase angle $\phi(t_k)$ at a zero-crossing point $t_k$.

$$\delta[k]=\phi(t[k])-\phi(t_k)[\text{rad}] \quad (12)$$

Here, a band-limited signal under measurement x(t) is a fundamental cosine wave having an amplitude A, as shown in the equation (1), and a phase angle $\phi(t)$ and an amplitude value x(t) are in the following relationship.

$$x(t)=A\cos(\phi(t))=A\sin(\phi(t)+(\pi/2))[\text{rad}] \quad (13)$$

For this reason, a phase angle $\phi(t)$ of a signal under measurement at a time point t can be expressed by the following equation (14) from the amplitude value x(t) at the time point t and the amplitude A using an arcsine function.

$$\phi(t)=\sin^{-1}(x(t)/A)-(\pi/2)[\text{rad}] \quad (14)$$

However, since an arcsine function can be expressed using a phase value in the range between $-\pi/2$ and $+\pi/2$, the equation (14) is valid in a range between $-\pi$ and 0 of the phase angle of the cosine wave, i.e., in a rising region of the cosine wave. Therefore, if an amplitude value at an approximated zero-crossing point t[k] is assumed as expressed by an equation (15)

$$x_{ZX}[k]=x(t[k]) \quad (15)$$

regarding a rising zero-crossing point of a fundamental cosine wave x(t), a phase angle $\phi(t[k])$ at t[k] is given by the following equation (16) from the equation (14).

$$\phi(t[k])=\sin^{-1}(x_{ZX}[k]/A)-(\pi/2)[\text{rad}] \quad (16)$$

On the other hand, since an amplitude value at a real rising zero-crossing point $t_k$ is 0, a phase angle $\phi(t_k)$ at $t_k$ is given by the following equation (17).

$$\phi(t_k)=\sin^{-1}(0/A)-(\pi/2)=-(\pi/2)[\text{rad}] \quad (17)$$

Therefore, a phase error $\delta[k]$ between the rising zero-crossing point $t_k$ and its approximated zero-crossing point t[k] can be obtained by the following equation (18) from the equations (12), (16) and (17).

$$\delta[k]=\arcsin(x_{ZX}[k]/A)[\text{rad}] \quad (18)$$

In addition, in the range between 0 and $\pi$ of the phase angle of the cosine wave, i.e., in a falling region, a phase angle $\phi(t)$ at a time point t is expressed by the following equation (19) from the amplitude value x(t) at the time point t and the amplitude A using an arcsine function.

$$\phi(t)=-(\sin^{-1}(x(t)/A)-(\pi/2))[\text{rad}] \quad (19)$$

Therefore, regarding a falling zero-crossing point of a fundamental cosine wave x(t), a phase error $\delta[k]$ between the approximated zero-crossing point and the real zero-crossing point can be obtained by the following equation (20).

$$\delta[k]=-\arcsin(x_{ZX}[k]/A)[\text{rad}] \quad (20)$$

In addition, a phase error $\delta[k]$ may be obtained by transforming a signal under measurement x(t) to an analytic signal z(t), $$z(t)=x(t)+j\hat{x}(t) \quad (21)$$

then by obtaining, from an analytic signal data z(t[k]) at the approximated zero-crossing point, $$z(t[k])=x(t[k])+j\hat{x}(t[k])\equiv x_{ZX}[k]+j\hat{x}_{ZX}[k] \quad (22)$$

an instantaneous phase $\phi[k]$ at the approximated zero-crossing point, $$\phi[k]=\tan^{-1}[\hat{x}_{ZX}[k]/x_{ZX}[k]][\text{rad}] \quad (23)$$

and then by calculating a difference from the instantaneous phase $\phi[k]$ at the approximated zero-crossing point.

That is, regarding the rising zero-crossing point, a difference $\delta[k]$ between the instantaneous phase $\phi[k]$ at the approximated zero-crossing point and the instantaneous phase $-\pi/2$ of the rising zero-crossing point is obtained.

$$\delta[k]=\phi[k]+(\pi/2)[\text{rad}] \quad (24)$$

Regarding the falling zero-crossing point, a difference $\delta[k]$ between the instantaneous phase $\phi[k]$ at the approximated zero-crossing point and the instantaneous phase $\pi/2$ of the rising zero-crossing point is obtained.

$$\delta[k]=\phi[k]-(\pi/2)[\text{rad}] \quad (25)$$

By the processes described above, a period jitter J[k] can be obtained by the following equation (26) from the equations (9) and (10) using the zero-crossing phase error data sequence $\delta[k]$.

$$J[k]=\left(T_{k,k+1}-\frac{\delta[k+1]-\delta[k]}{\frac{2\pi}{T_0}}-T_0\right)\cdot\frac{T_0}{T_{k,k+1}}[\text{sec}] \quad (26)$$

In this case, the terms in the parentheses( ) in right side represent, as shown in FIG. 8, a difference between an instantaneous period T[k]

$$T[k] = T_{k,k+1} - \frac{\delta[k+1] - \delta[k]}{\frac{2\pi}{T_0}} \quad [\text{sec}] \qquad (27)$$

of the signal under measurement and the fundamental period $T_0$, i.e., a period jitter (uncorrected period jitter). In addition, the term of($T_0/T_{k,k+1}$) is a correction term to the period jitter obtained from the approximated zero-crossing point. A period jitter can be obtained with higher accuracy by this correction.

As shown in FIG. 9, the correction term can reduce an error between an estimated value and a theoretical value of jitter with respect to an RMS value and a peak-to-peak value of period jitter. That is, when the correction term is not used, there are errors of +0.53% and +15.9% to the RMS value and the peak-to-peak value, respectively, but in the method of the present invention using the correction term, those errors are remarkably decreased to −0.004% and +0.04%, respectively. Further, the data in FIG. 9 are obtained from a computer simulation with respect to a signal having a sinusoidal jitter. In addition, an experimental result using a real waveform is shown in FIG. 10A. The numbers of samplings per period are shown in the lateral axis, and RMS values of period jitter are shown in the longitudinal axis. In this case, the RMS value is substantially constant regardless of the number of samplings, and similar results are obtained in the case where the correction term is used and in the case where the correction term is not used. On the other hand, it is understood from an experimental result that the method not using the correction term overestimates peak-to-peak values of period jitter as the over-sampling rate decreases, but peak-to-peak values of period jitter can accurately be obtained by the method of the present invention using the correction term. Particularly, when the over-sampling rate is small, the effect of the present invent is large. For example, in the example of FIG. 10B, according to the present invention, when the number of samplings per period is 8 points (over-sampling rate is 4), the error can be corrected by approximately 8%, and when the number of samplings per period is 3 points (over-sampling rate is 1.5), the error can be corrected by approximately 18%.

In the jitter measurement method according to the present invention, in order to extract a fundamental frequency component of the clock signal under measurement x(t), the clock signal under measurement x(t) is band-limited first using a band-pass filter. The band-limited clock signal $x_{BP}(t)$ is sampled at the timings (approximated zero-crossing points) closest to the corresponding zero-crossing points of the band-limited clock signal $x_{BP}(t)$, then a phase error sequence δ[n] between the approximated zero-crossing points and the corresponding zero-crossing points of the signal under measurement is obtained from this zero-crossing sample sequence $x_{ZX}[n]$. Next, a period jitter sequence of the signal under measurement is estimated using the formula in parentheses ( ) of the equation (26) from the phase error sequence δ[n]. In this case, the period for obtaining a period jitter may be m periods (m=0.5, 1, 2, 3, . . . ). For example, by taking the m=0.5 period, a fluctuation of a time interval between a rising (or falling) zero-crossing point and a next falling (or rising) zero-crossing point may be obtained. Also, by taking the m=2 periods, a fluctuation of a time interval between a rising (or falling) zero-crossing point and a rising (or falling) zero-crossing point after two rising (or falling) points from the first rising (or falling) zero-crossing point may be obtained. Then the period jitter sequence data are multiplied by the correction term ($T_0/T_{k,k+1}$) to correct the values of the period jitter sequence. FIG. 11 shows a period jitter waveform J[n] of the signal under measurement x(t) obtained using m=1 period. In addition, by calculating a root-mean-square value and a difference value between the maximum value and the minimum value of the period jitter data measured in this manner using the following equations (28) and (29) respectively, an RMS $J_{RMS}$ value and a peak-to-peak $J_{PP}$ value of the period jitter can be obtained.

$$J_{\text{RMS}} = \sqrt{\frac{1}{M} \sum_{k=1}^{M} J^2[k]} \quad [\text{sec}] \qquad (28)$$

$$J_{PP} = \max_{k}(J[k]) - \min_{k}(J[k]) \quad [\text{sec}] \qquad (29)$$

In this case, M is the number of samples of the measured period jitter data. FIG. 12 shows a histogram (FIG. 12A) of the period jitter measured by the jitter measurement method according to the present invention and a histogram (FIG. 12B) measured by the conventional time interval analyzer. Thus, the histogram measured by the method of the present invention can be comparable with the histogram of the conventional time interval analyzer. Both histograms indicate the similar waveforms to each other. In addition, FIG. 13 shows an RMS value and a peak-to-peak value of the period jitter measured by the jitter measurement method according to the present invention as well as the corresponding values measured by the time interval analyzer. In this case, the peak-to-peak value $J_{PP}$ of the observed period jitter is substantially proportional to a square root of logarithm of the number of events (the number of zero-crossings). For example, in the case of approximately 5000 events, $J_{PP}$=45 ps is a correct value. A $J_{PP}$ error in FIG. 13 is shown assuming that 45 ps is the correct value. As shown in FIGS. 12A, 12B, and 13, the jitter measurement method according to the present invention can provide measured jitter values comparable with the conventional measurement method.

Furthermore, the jitter measurement method according to the present invention can measure a cycle-to-cycle period jitter and a period jitter simultaneously. A cycle-to-cycle period jitter $J_{CC}$ is a period fluctuation between adjacent cycles, and is expressed by the following equation (30).

$$J_{CC}[k] = T[k+1] - T[k] = \qquad (30)$$
$$(T_0 + J[k+1]) - (T_0 + J[k]) = J[k+1] - J[k] \quad [\text{sec}]$$

Therefore, by obtaining differences between the period jitter data measured as described above, and then by calculating their root-mean-square and a difference between the maximum value and the minimum value using the following equations (31) and (32) respectively, an RMS value $J_{CC,RMS}$ and a peak-to-peak value $J_{CC,PP}$ of cycle-to-cycle period jitter can be obtained.

$$J_{CC,\text{RMS}} = \sqrt{\frac{1}{L} \sum_{k=1}^{L} J_{CC}^2[k]} \quad [\text{sec}] \qquad (31)$$

$$J_{CC,PP} = \max_{k}(J_{CC}[k]) - \min_{k}(J_{CC}[k]) \quad [\text{sec}] \qquad (32)$$

In this case, L is the number of samples of the measured cycle-to-cycle period jitter data. FIG. 14 and FIG. 15 show waveforms of a cycle-to-cycle period jitter $J_{cc}[n]$ and its histogram obtained by the jitter measurement method according to the present invention, respectively.

The jitter measurement method according to the present invention can be applied, as described above, not only to the estimation of jitter of a clock signal but also to the estimation of jitter of the other signals.

In the jitter measurement method according to the present invention, a band-pass filtering process may be applied, after an analog signal under measurement is digitized, to the digitized signal under measurement, or the analog signal waveform may be digitized, after the band-pass filtering process is applied to the analog signal under measurement. The band-pass filtering process may be performed by either one of an analog filter, a digital filter and a software using Fourier transform. In addition, it is desirable that a high-speed AD converter, a high-speed digitizer or a high-speed digital sampling oscilloscope is used for the digitization of the analog signal.

In addition, in the jitter measurement method according to the present invention, a period jitter can also be measured with high accuracy by removing amplitude modulation (AM) components of the signal under measurement using waveform clipping means in the state that phase modulation (PM) components corresponding to jitter are retained.

Band-Pass Filter

A band-limitation of a digitized digital signal can be realized by a digital filter, and can also be performed by Fourier transform. Next, a band-pass filtering using FFT (Fast Fourier Transform) will be explained below. FFT is a method of transforming at high speed a signal waveform in time domain to a signal in frequency domain.

First, a digitized signal under measurement x(t) shown in FIG. 16 is transformed to a signal X(f) in frequency domain using FFT. FIG. 17 shows a power spectrum of the transformed signal X(f). Then data around a fundamental frequency (400 MHz in this example) of the signal X(f) are retained and the other data are made zero. FIG. 18 shows a signal $X_{BP}(f)$ of the band-limited signal in frequency domain. Finally, a band-limited signal waveform $X_{BP}(t)$ in time domain can be obtained by applying inverse FFT to the band-limited signal $X_{BP}(f)$ in frequency domain. FIG. 19 shows the band-limited signal waveform $x_{BP}(t)$ in time domain.

Approximated Zero-Crossing Point Detection Method

Next, an approximated zero-crossing point detection method will be described. First, the maximum value of an inputted signal under measurement is defined as 100% level, and the minimum value is defined as 0% level to calculate 50% level signal value V (50%) as a zero crossing level. Then, a difference between a sample value x(j−1) and the 50% level V (50%) of the x(t) and a difference between its adjacent sample value x(j) and the 50% level V(50%) of the x(t), i.e., (x(j−1)−V(50%)) and (x(j)−V(50%)) are calculated, and furthermore a product of those difference values (x(j−1)−V(50%))×(x(j)−V(50%)) is calculated. When the x(t) crosses 50% level, i.e., zero-crossing level, the sign of the difference between the sample value and the V(50%), i.e., (x(j−1)−V(50%)) or (x(j)−V(50%)) changes from a negative sign to a positive sign or from a positive sign to a negative sign. Therefore, when the product is negative, it is detected that the x(t) has passed the zero-crossing level, and a time point j−1 or j, at which a smaller absolute value of the difference between the sample value and the V (50%), i.e., (x(j−1)−V(50%)) or (x(j)−V(50%)) is detected, is obtained as an approximated zero crossing point. FIG. 20 shows a waveform of an inputted signal under measurement. The marks o in FIG. 20 indicate the detected points (approximated zero-crossing points) closest to the corresponding rising zero-crossing points.

Waveform Clipping

Waveform clipping means removes AM components from an input signal and retains only PM components in the input signal. A waveform clipping is performed by: 1) multiplying an analog or digital input signal by a constant, 2) replacing a signal value greater than a predetermined threshold value Th1 with the threshold value Th1, and 3) replacing a signal value less than a predetermined threshold value Th2 with the threshold value Th2. Here, it is assumed that the threshold value Th1 is greater than the threshold value Th2. FIG. 21 shows a clock signal having AM components. Since an envelope of a time waveform fluctuates, it is seen that the AM components exist. FIG. 22 shows a clock signal that has been clipped by clipping means. Since the time waveform shows a constant envelope, it is confirmed that AM components have bee removed.

DESCRIPTION OF THE EMBODIMENTS

The embodiments of the present invention will be described below.

Figure 1:
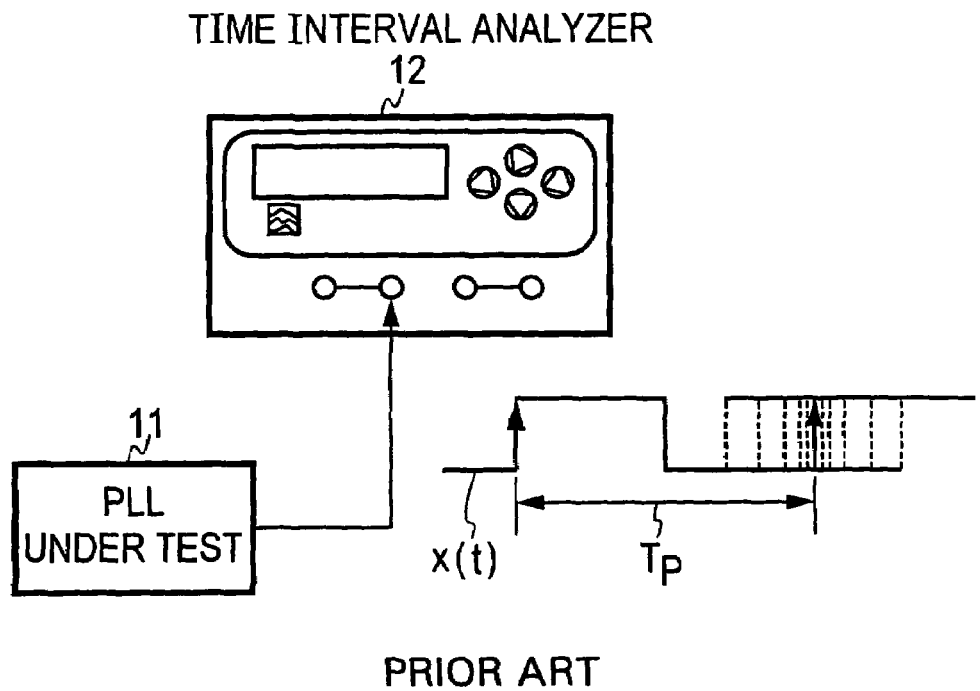
FIG. 1 is a diagram showing an example of jitter measurement using a time interval analyzer.
Figure 2:
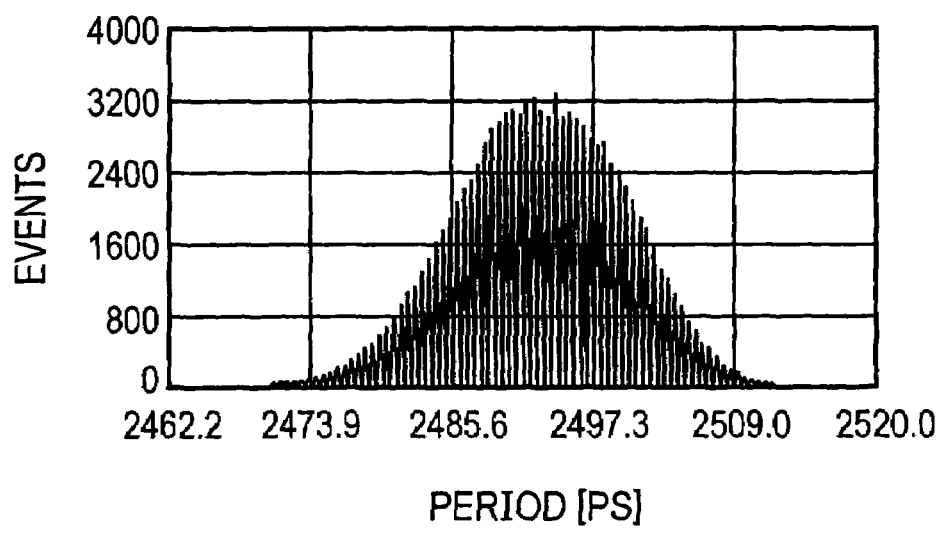
FIG. 2 is a diagram showing an example of histogram of period jitter measured using a time interval analyzer.
Figure 3:
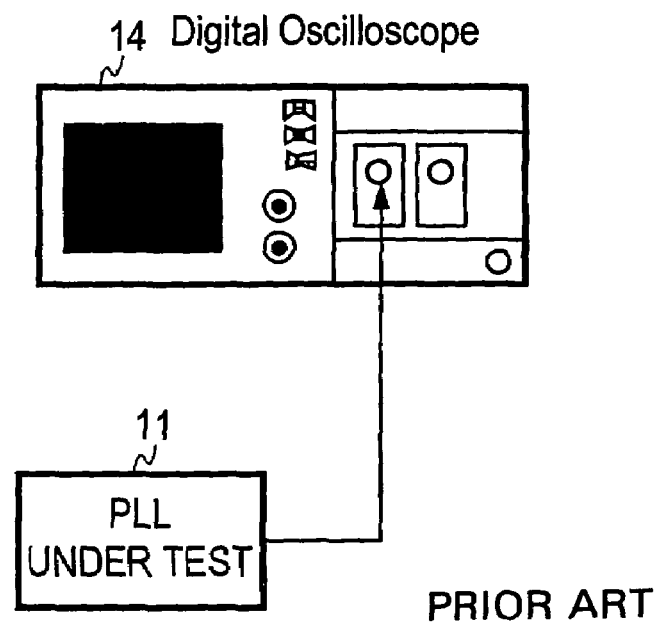
FIG. 3 is a diagram showing an example of jitter measurement using a oscilloscope.
Figure 4:
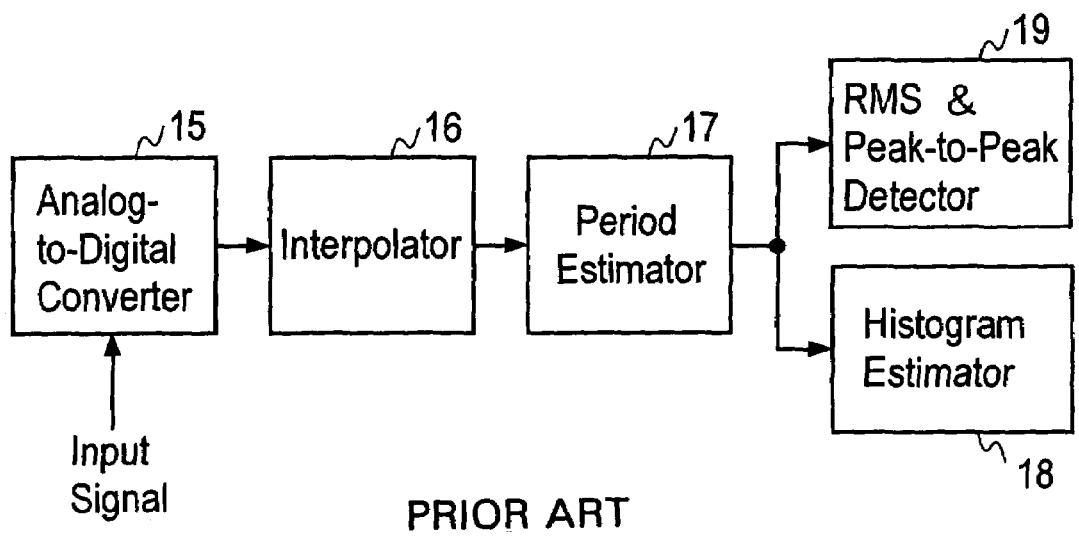
FIG. 4 is a block diagram showing a functional configuration example of an interpolation based jitter measurement method.
Figure 5A:
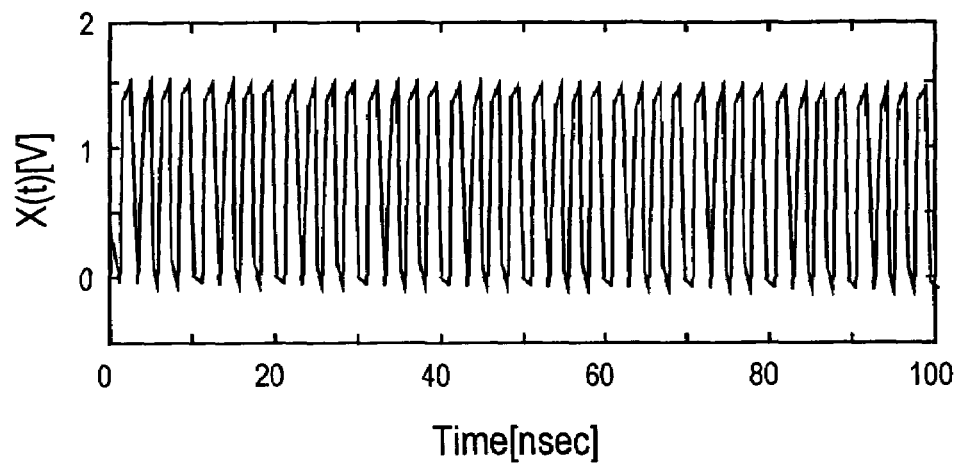
FIG. 5A is a diagram showing a waveform example of a signal under measurement.
Figure 5B:
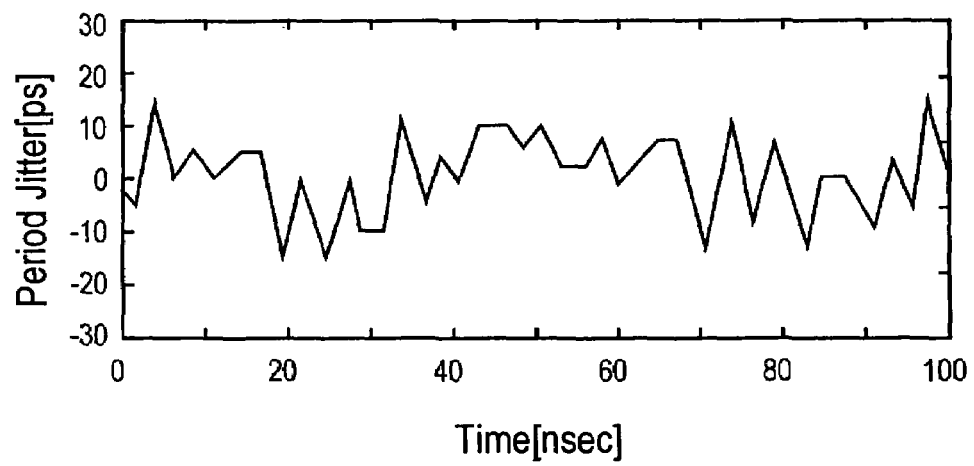
FIG. 5B is a diagram showing a waveform example of period jitter of the signal under measurement shown in FIG. 5A.
Figure 6:
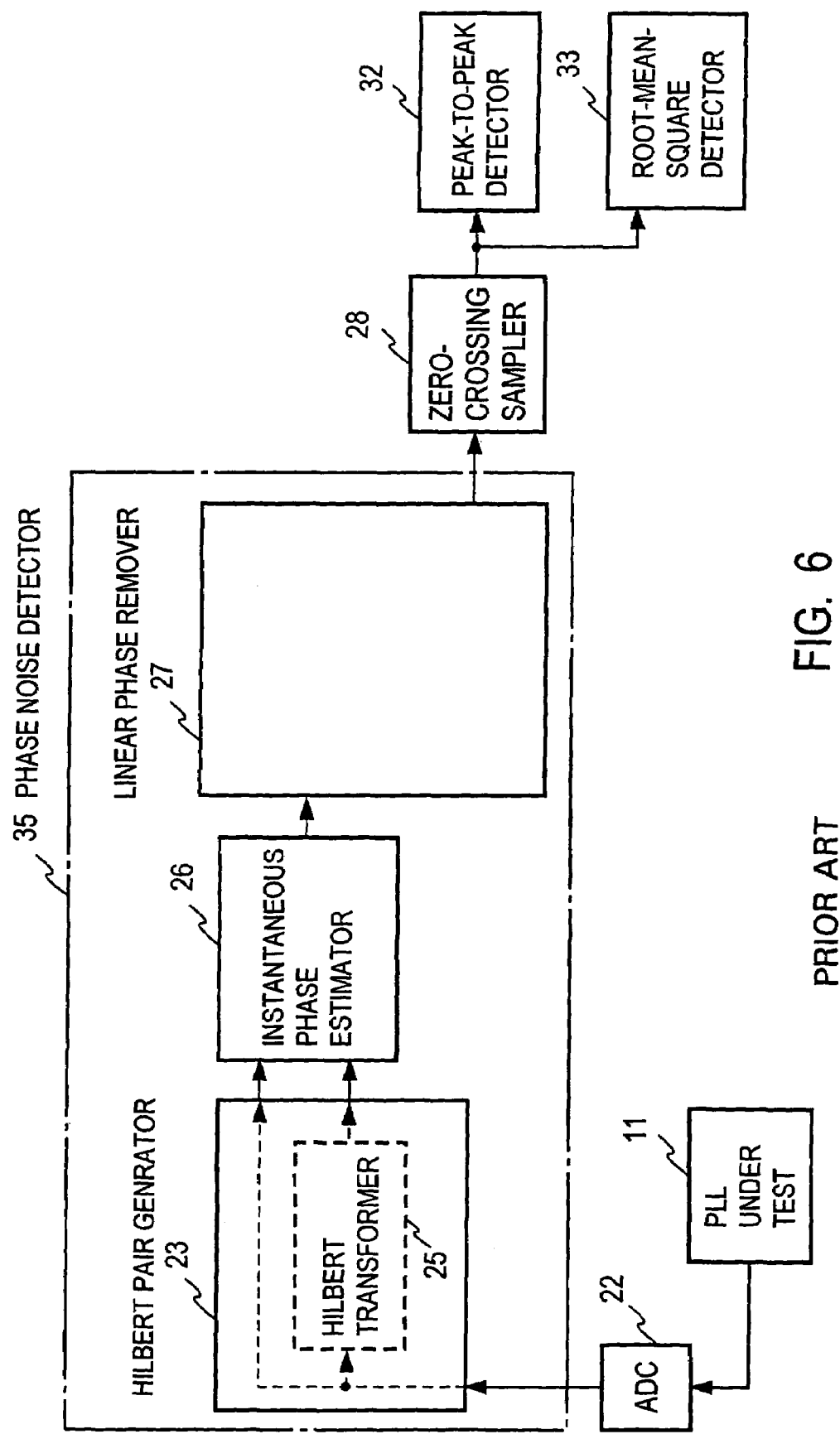
FIG. 6 is a block diagram showing a functional configuration example of a jitter measurement by a conventional Δφ method.
Figure 7A:
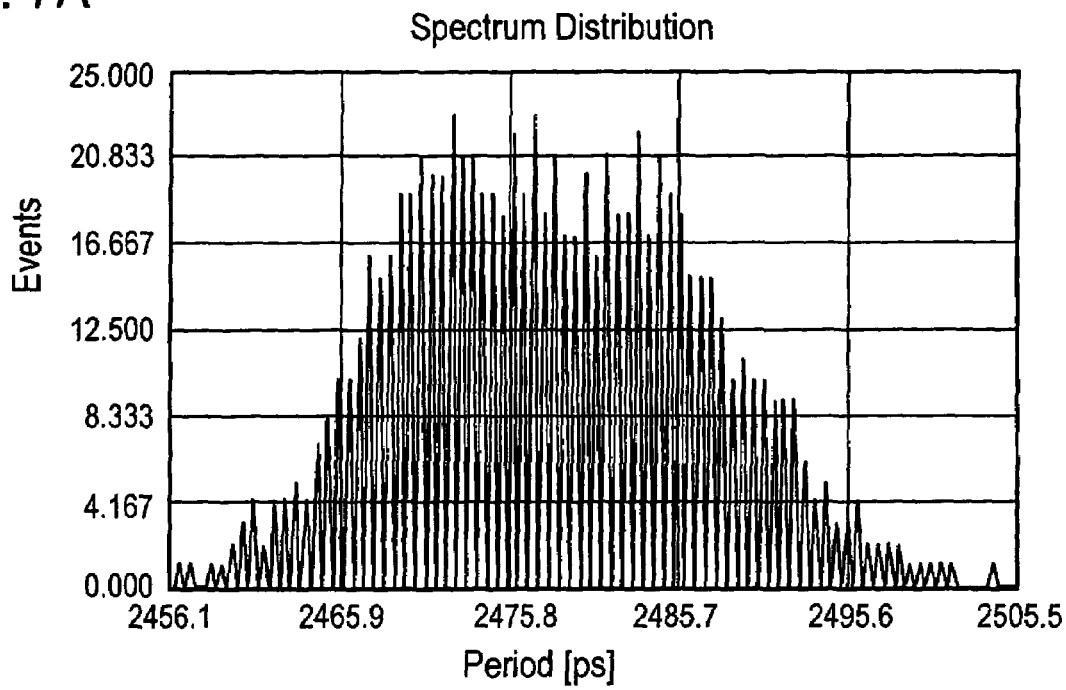
FIG. 7A is a diagram showing a histogram example of a jitter measurement result by a time interval analyzer.
Figure 7B:
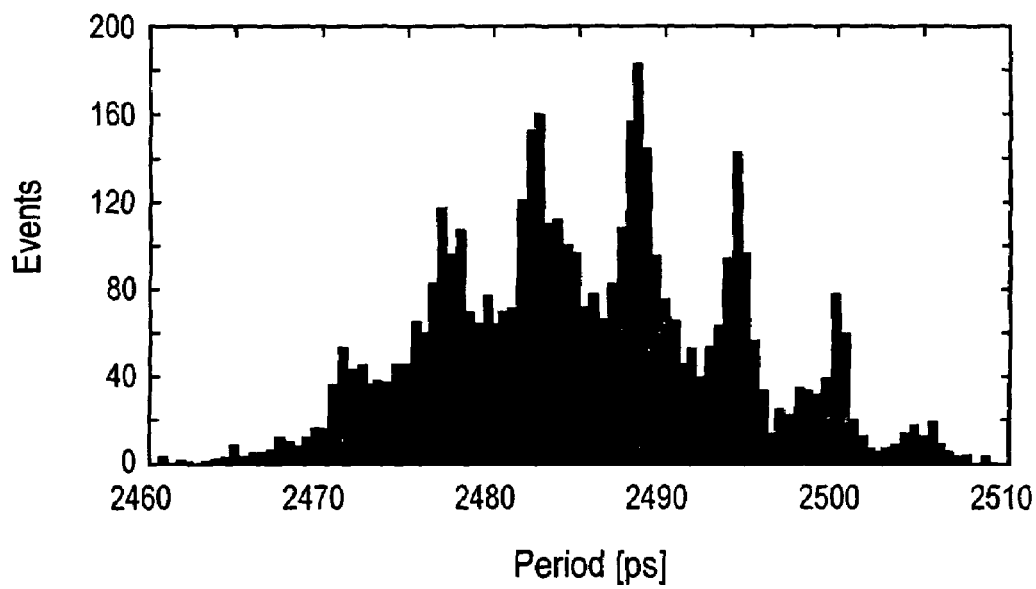
FIG. 7B is a diagram showing a histogram example of a jitter measurement result by an interpolation based jitter measurement method.
Figures 8, 9:
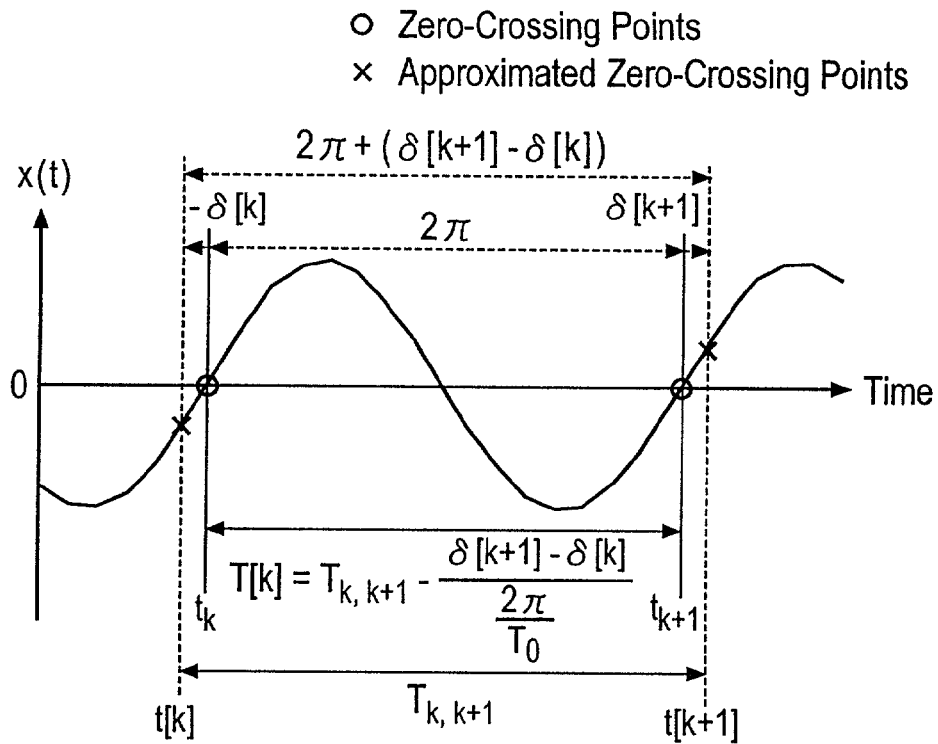
FIG. 8 is a diagram typically showing a calculation method of an instantaneous angular frequency.
FIG. 9 is a diagram showing result examples of computer simulation for respective period jitter estimations according to the method of the present invention in the case where a correction term is not used and in the case where a correction term is used.
Figure 10A:
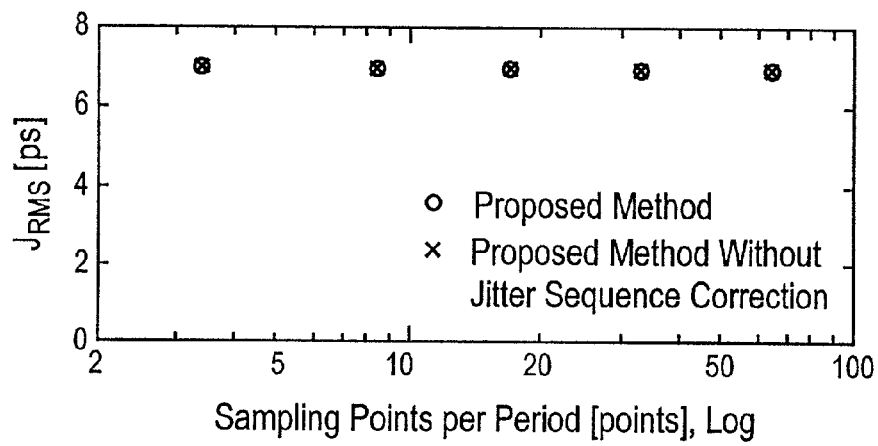
FIG. 10A is a diagram showing respective relationship examples between root-mean-square values of period jitter obtained by the method of the present invention and the numbers of over-samplings in the case of using the correction term and in the case of not using the correction term.
Figure 10B:
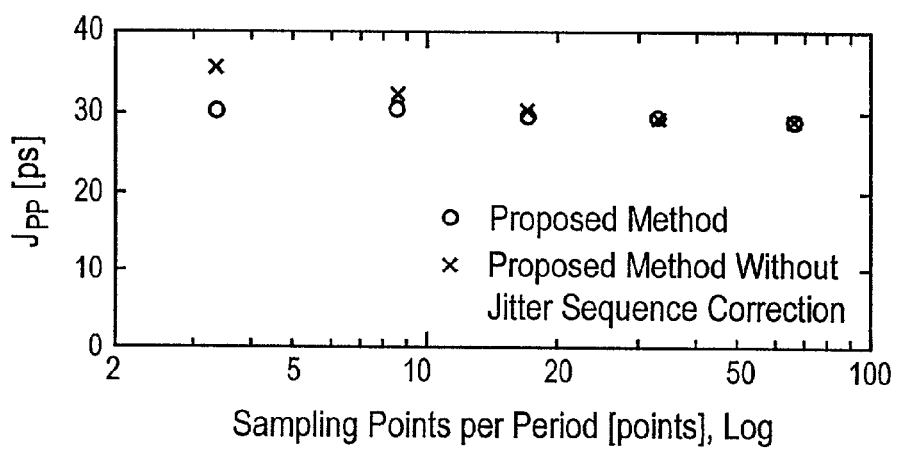
FIG. 10B is a diagram showing respective relationship examples between peak-to-peak values of period jitter obtained by the method of the present invention and the numbers of over-samplings in the case of using the correction term and in the case of not using the correction term.
Figure 11:
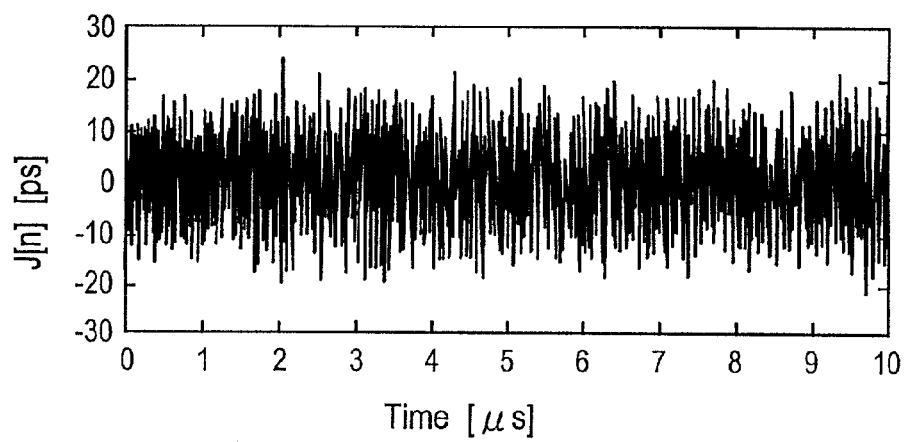
FIG. 11 is a diagram showing an example of period jitter waveform of a clock signal under measurement.
Figure 12A:
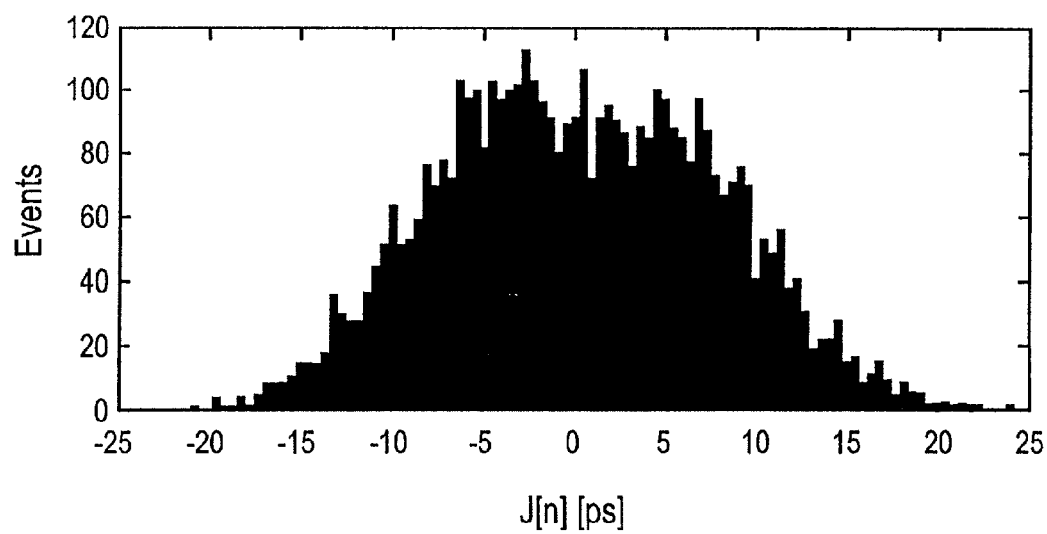
FIG. 12A is a diagram showing an example of period jitter histogram measured by the jitter measurement method according to the present invention.
Figure 12B:
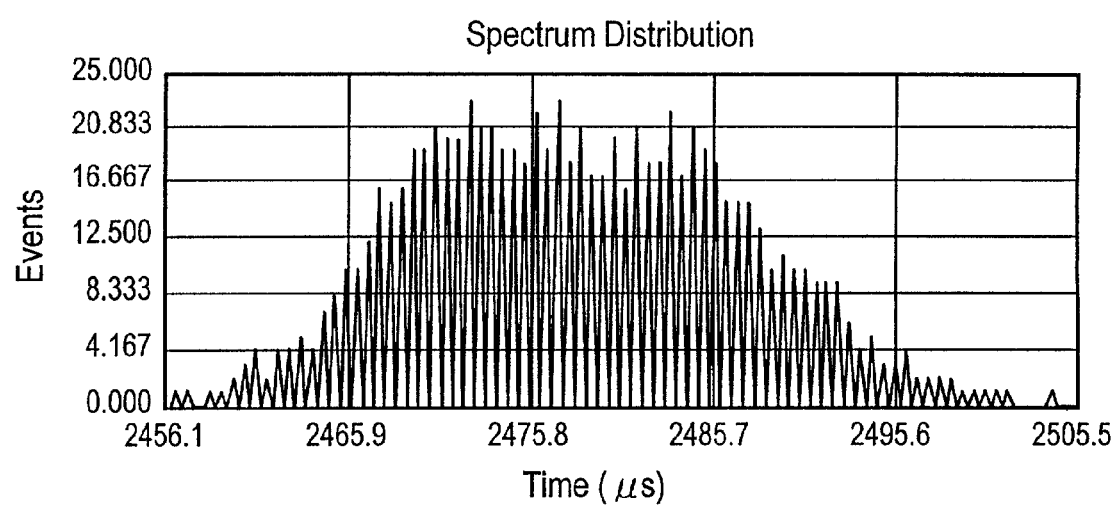
FIG. 12B is a diagram showing an example of period jitter histogram measured by a time interval analyzer.
Figures 13, 14:
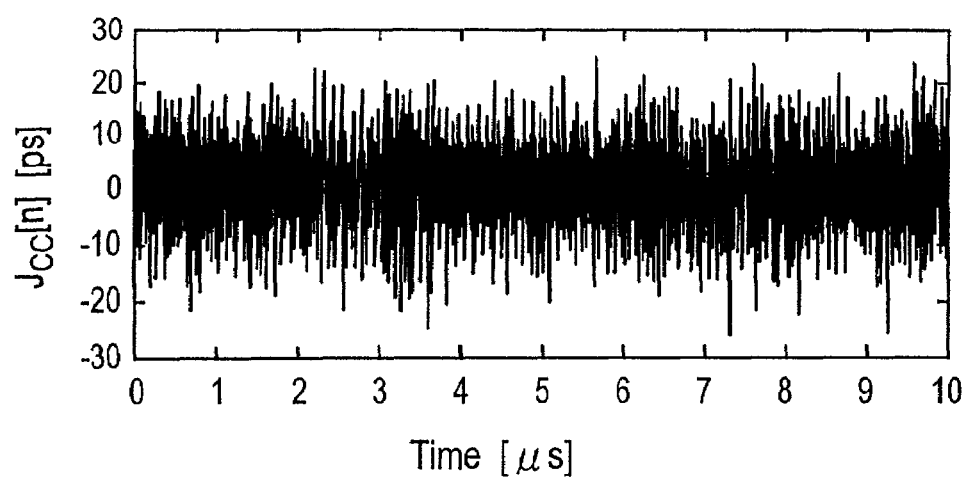
FIG. 13 is a diagram for comparing period jitter values measured by the time interval analyzer method with period jitter values measured by the jitter measurement method according to the present invention.
FIG. 14 is a diagram showing an example of cycle-to-cycle period jitter waveform of a clock signal under measurement.
Figure 15:
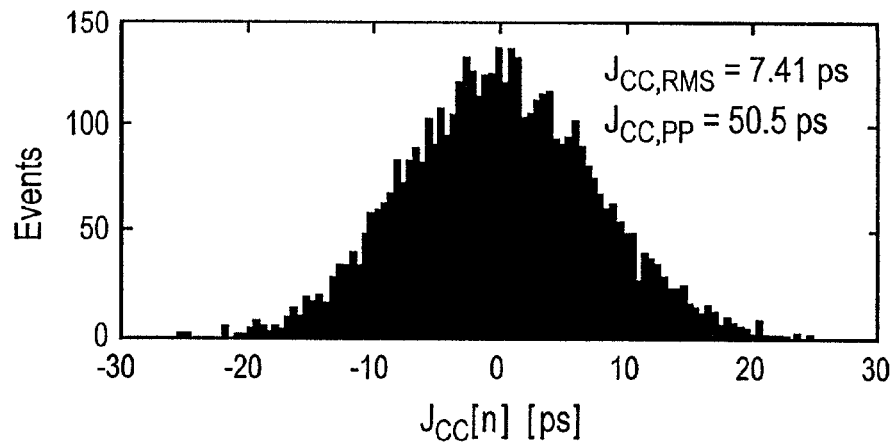
FIG. 15 is a diagram showing an example of cycle-to-cycle period jitter histogram measured by the jitter measurement method according to the present invention.
Figure 16:
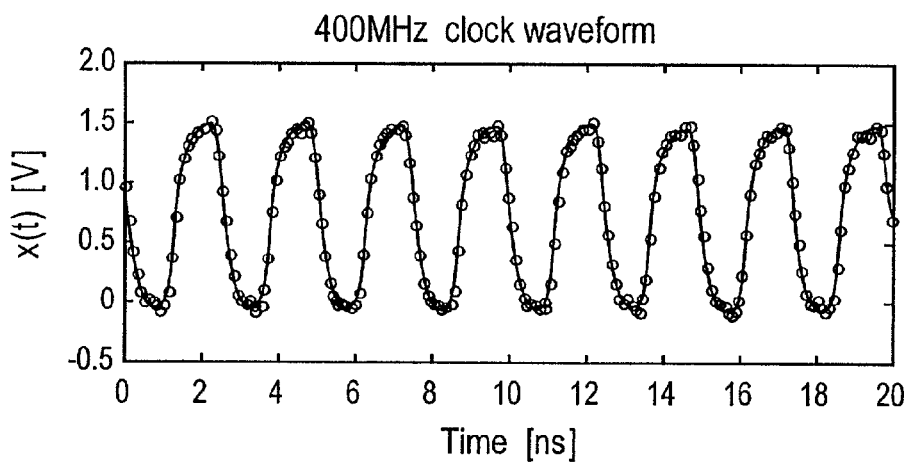
FIG. 16 is a diagram showing an example of digitized signal under measurement.
Figure 17:
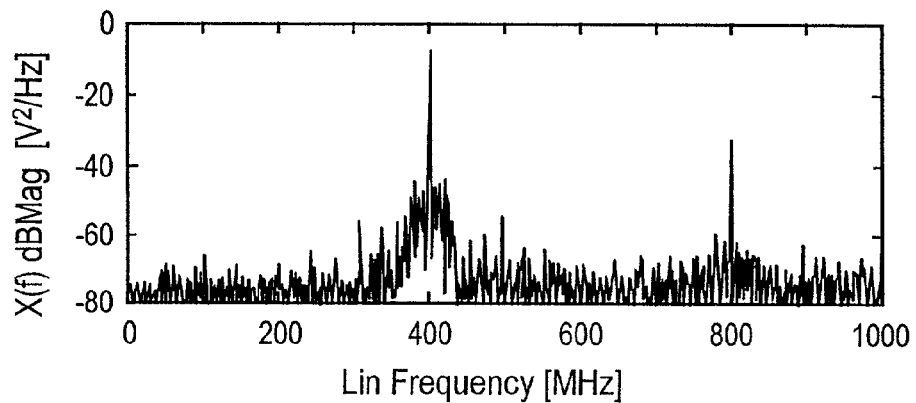
FIG. 17 is a diagram showing an example of power spectrum of a signal under measurement obtained by FFT.
Figure 18:
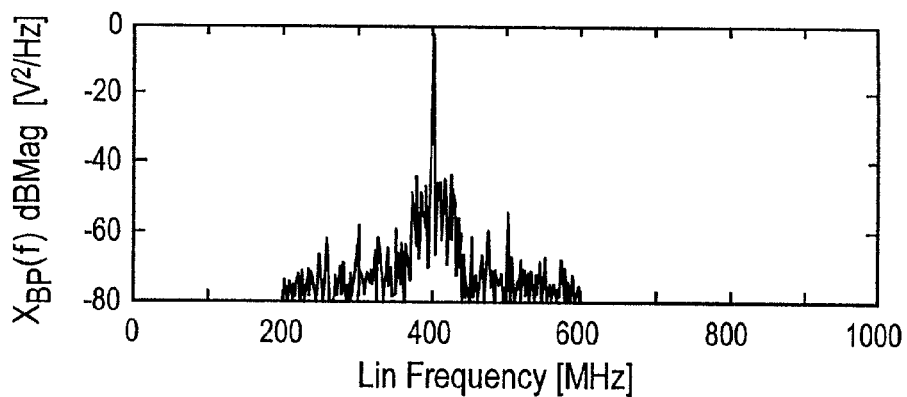
FIG. 18 is a diagram showing an example of band-limited power spectrum.
Figure 19:
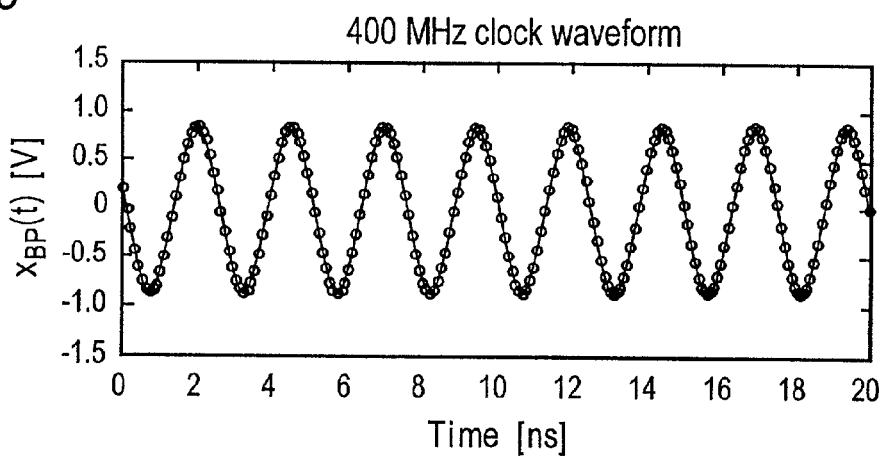
FIG. 19 is a diagram showing an example of band-limited signal under measurement obtained by inverse FFT.
Figure 20:
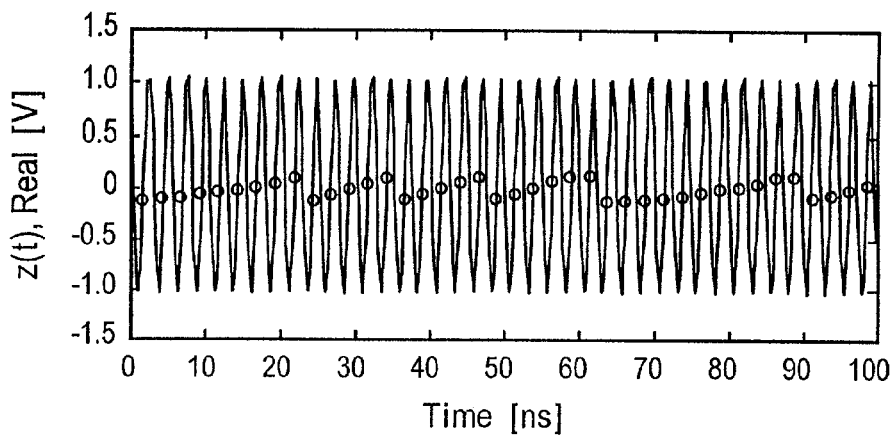
FIG. 20 is a diagram showing an example of approximated zero-crossing points of a signal under measurement.
Figure 21:
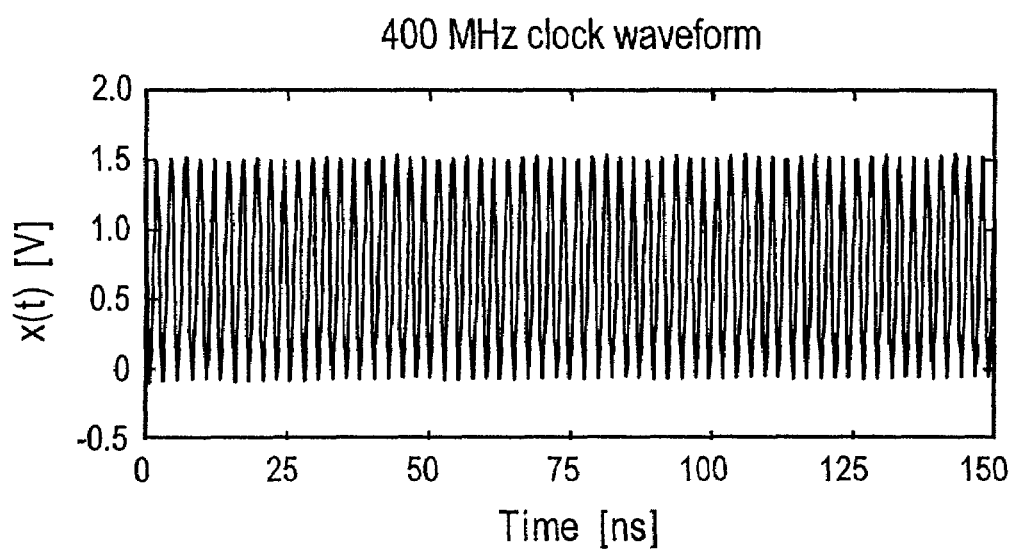
FIG. 21 is a diagram showing an example of clock signal under measurement that has AM components.
Figure 22:
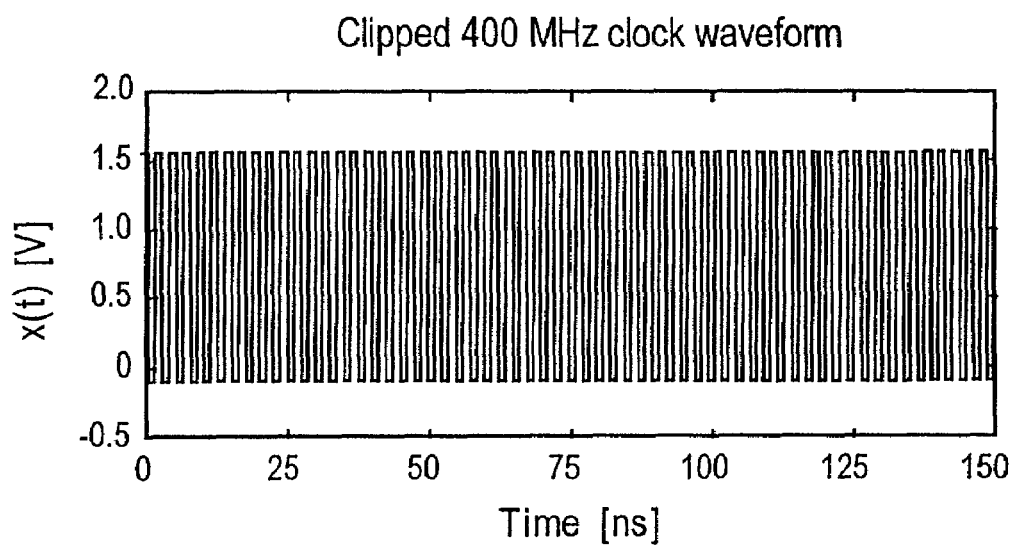
FIG. 22 is a diagram showing an example of clock signal under measurement that does not have AM components.
Figure 23:
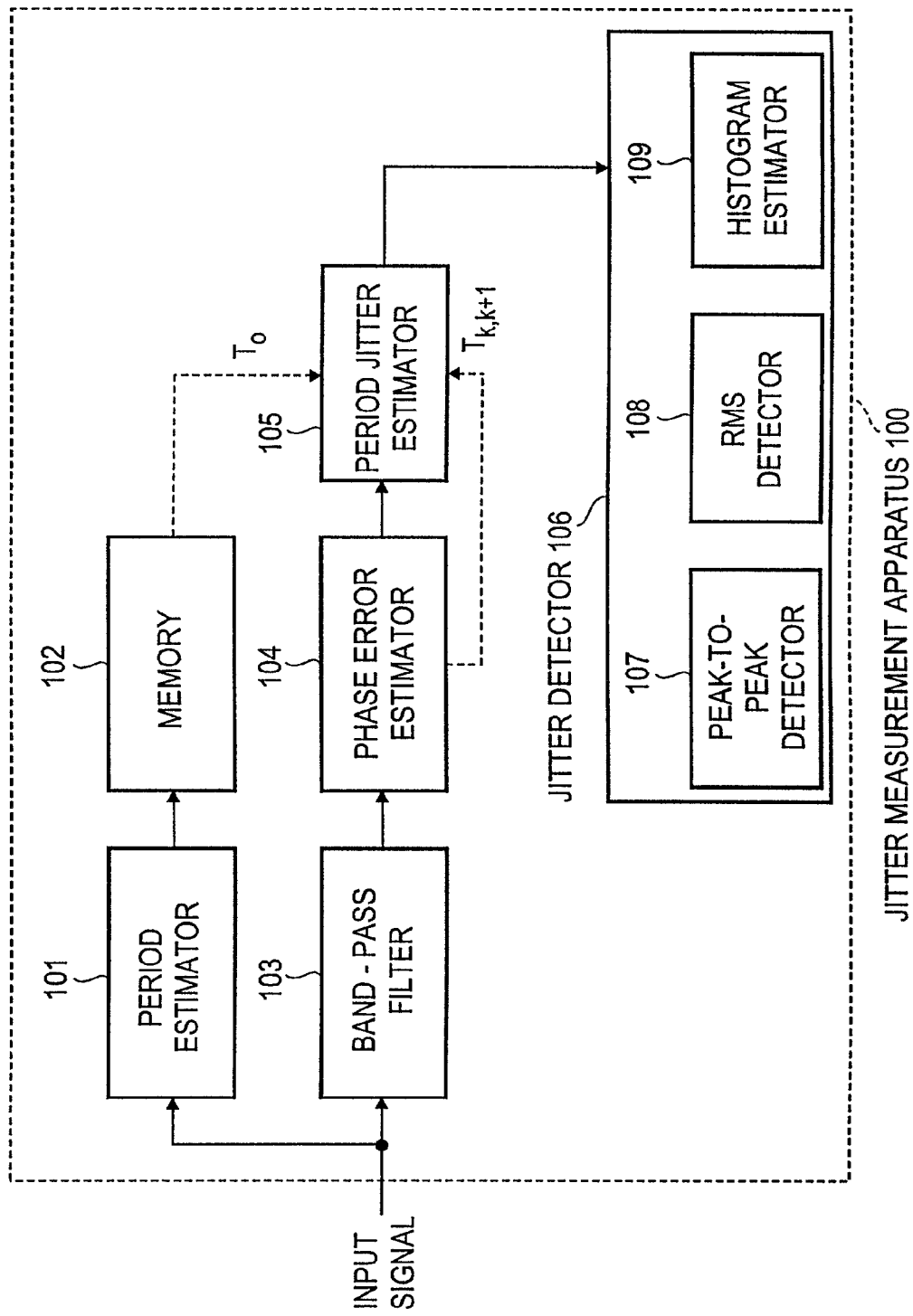
FIG. 23 is a diagram showing an example of functional configuration of a jitter measurement apparatus according to the present invention.

FIG. 23 shows an example of configuration of a jitter measurement apparatus used in the embodiment of the present invention. This jitter measurement apparatus 100 comprises: a (fundamental) period estimator 101 for obtaining a period $T_0$ of a fundamental wave of a signal under measurement; a memory 102 for storing therein the fundamental period estimated by the fundamental period estimator 101; a band-pass filter 103 for passing therethrough predetermined frequency components (components around the fundamental frequency) of the signal under measurement; a phase error estimator 104 for estimating sampling points (approximated zero-crossing points) t[k] (k=1, 2, 3, . . . ) close to corresponding zero-crossing points of the signal that has passed through the band-pass filter 103, for obtaining phase errors δ[k] between the approximated zero-crossing points and the corresponding zero-crossing points of the signal under measurement, and for outputting a zero-crossing phase error data sequence δ[k] and a zero-crossing time interval sequence $T_{k,k+1}$ between the approximated zero-crossing points; a period jitter estimator 105 for obtaining a period jitter sequence J[k] of the signal under measurement using the equation (26) from the zero-crossing phase error data sequence δ[k] and the zero-crossing time interval sequence $T_{k,k+1}$ estimated by the zero-crossing phase error estimator 104 and the fundamental period $T_0$ stored in the memory 102; and a jitter detector 106 to which the period jitter sequence J[k] is inputted for obtaining a jitter of the signal under measurement from the period jitter sequence J[k].

Figure 27:
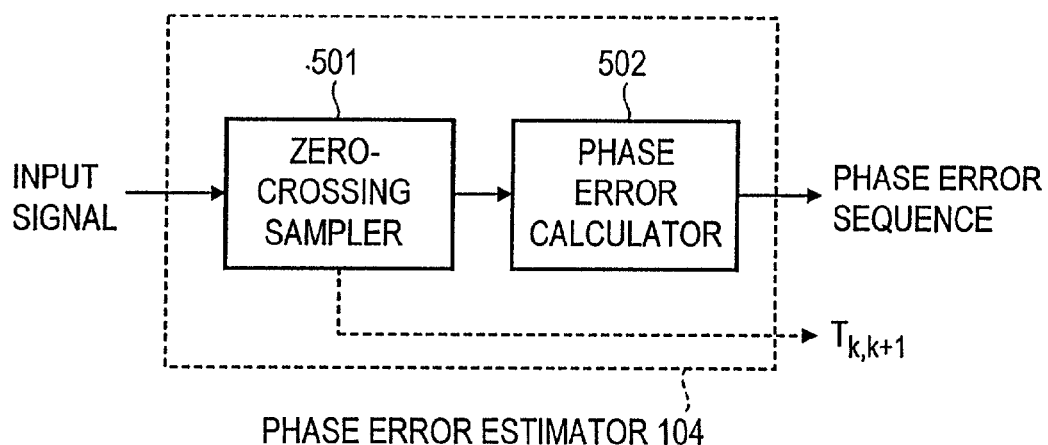
FIG. 27 is a diagram showing an example of the functional configuration of the phase error estimator 104 in FIG. 23.
Figure 29:
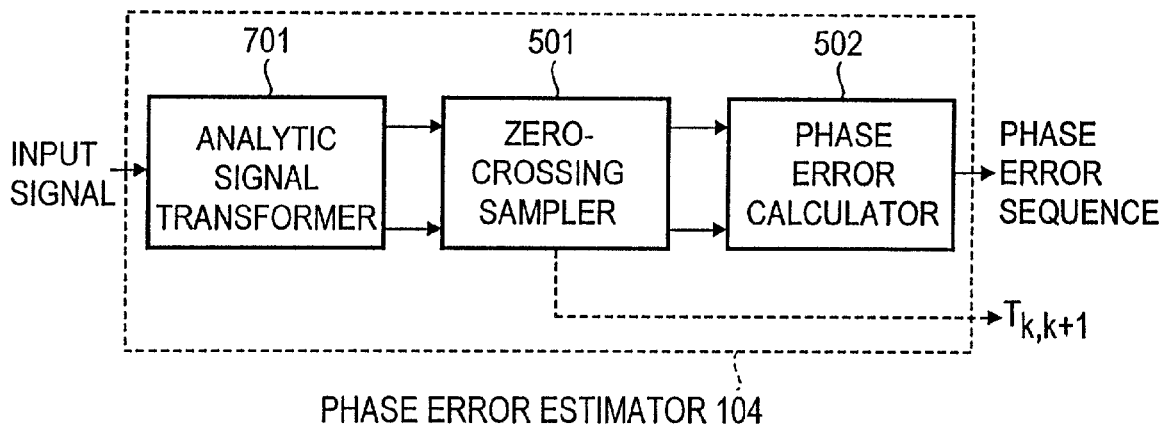
FIG. 29 is a diagram showing another example of the functional configuration of the phase error estimator 104 in FIG. 23.
Figure 31:
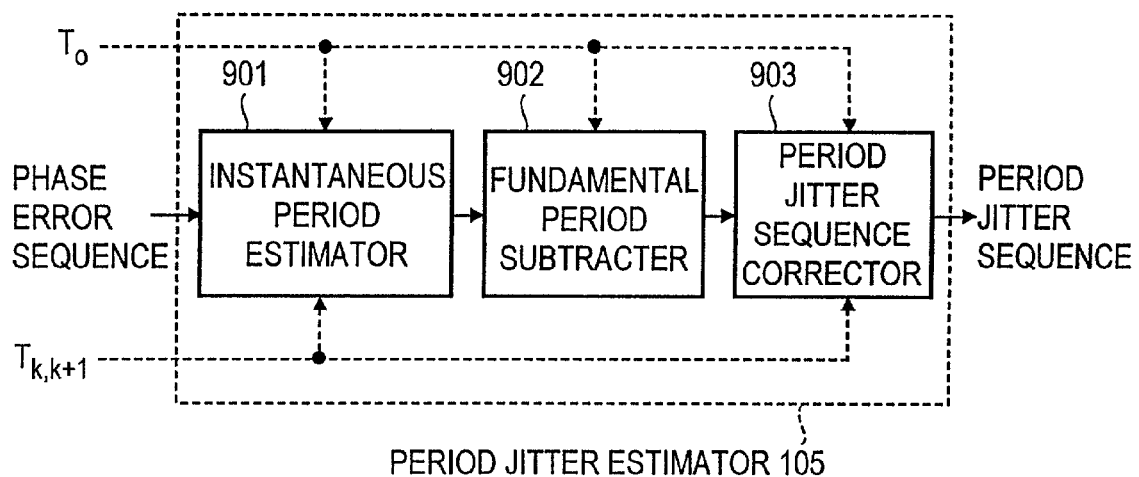
FIG. 31 is a diagram showing an example of the functional configuration of the period jitter estimator 105 in FIG. 23.
Figure 33:
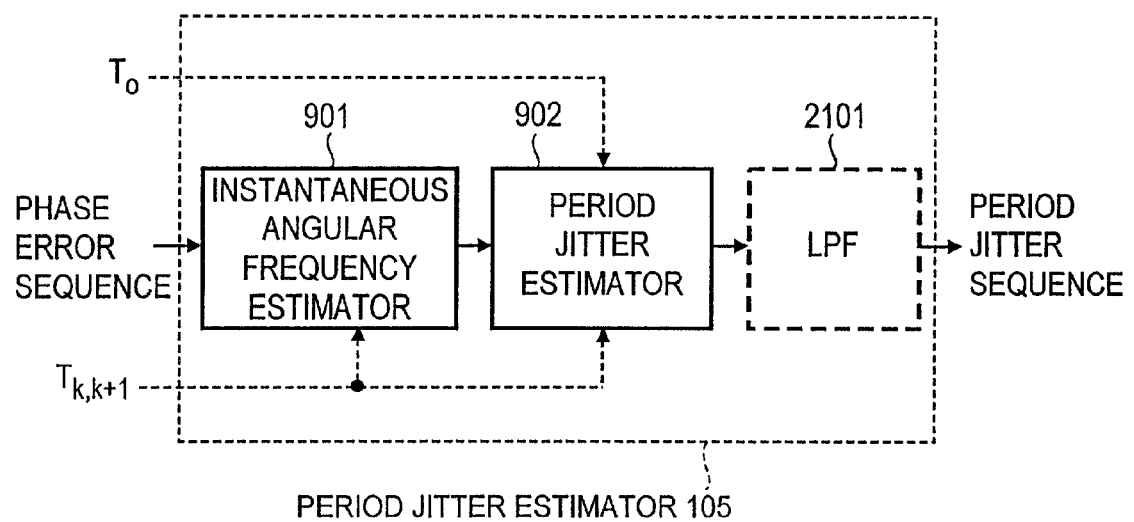
FIG. 33 is a diagram showing another example of functional configuration of the period jitter estimator 105 in FIG. 23.
Figure 35:
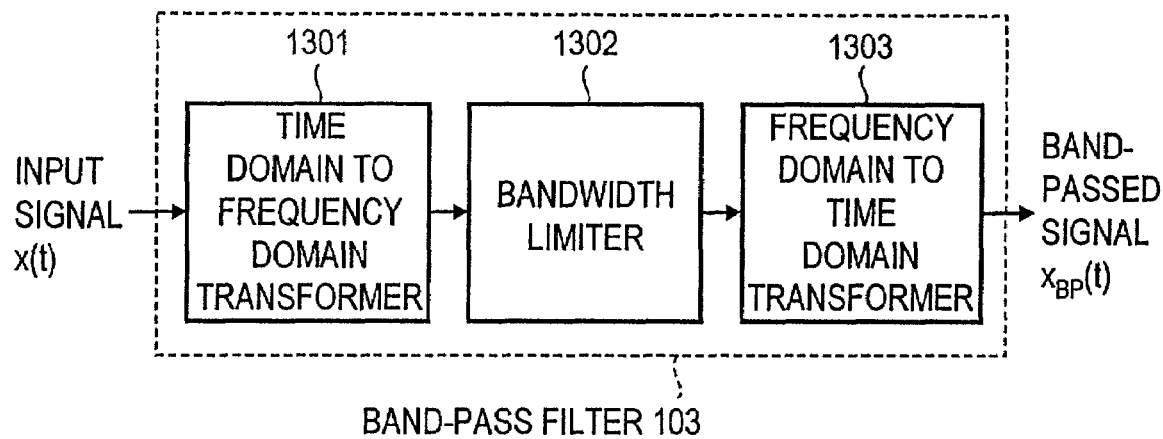
FIG. 35 is a diagram showing an example of the functional configuration of the band-pass filter 103 in FIG. 23.
Figure 37:
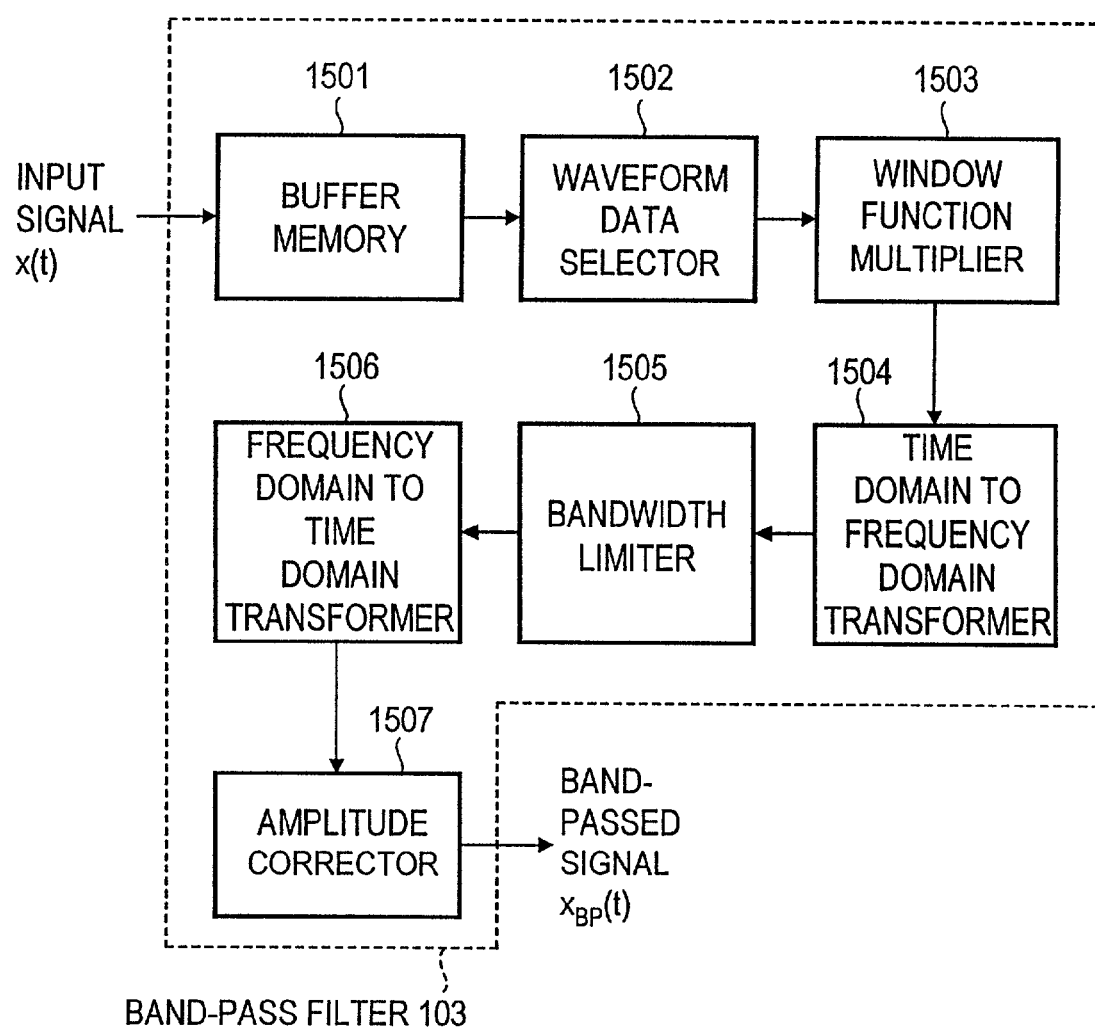
FIG. 37 is a diagram showing another example of the functional configuration of the band-pass filter 103 in FIG. 23.

In addition, the jitter estimator 106 comprises a peak-to-peak detector 107 for obtaining a difference between the maximum value and the minimum value of the period jitter sequence J[k] using the equation (29), an RMS detector 108 for calculating a root-mean-square value of the period jitter sequence J[k] using the equation (28), and a histogram estimator 109 for obtaining a histogram of the period jitter sequence J[k]. In addition, the band-pass filter 103 may be an analog filter or a digital filter, and moreover, the band-pass filter 103 may be a band-pass filter constituted by a software using FFT or the like as shown in FIG. 35 or FIG. 37. In addition, the phase error estimator 104 may be configured as shown in FIG. 27 or FIG. 29. In addition, the period jitter estimator 105 may be configured as shown in FIG. 31 or FIG. 33. A predetermined value can be stored in the memory 102 in advance as the fundamental period $T_0$. In this case, the fundamental period estimator 101 can be omitted.

Figure 24:
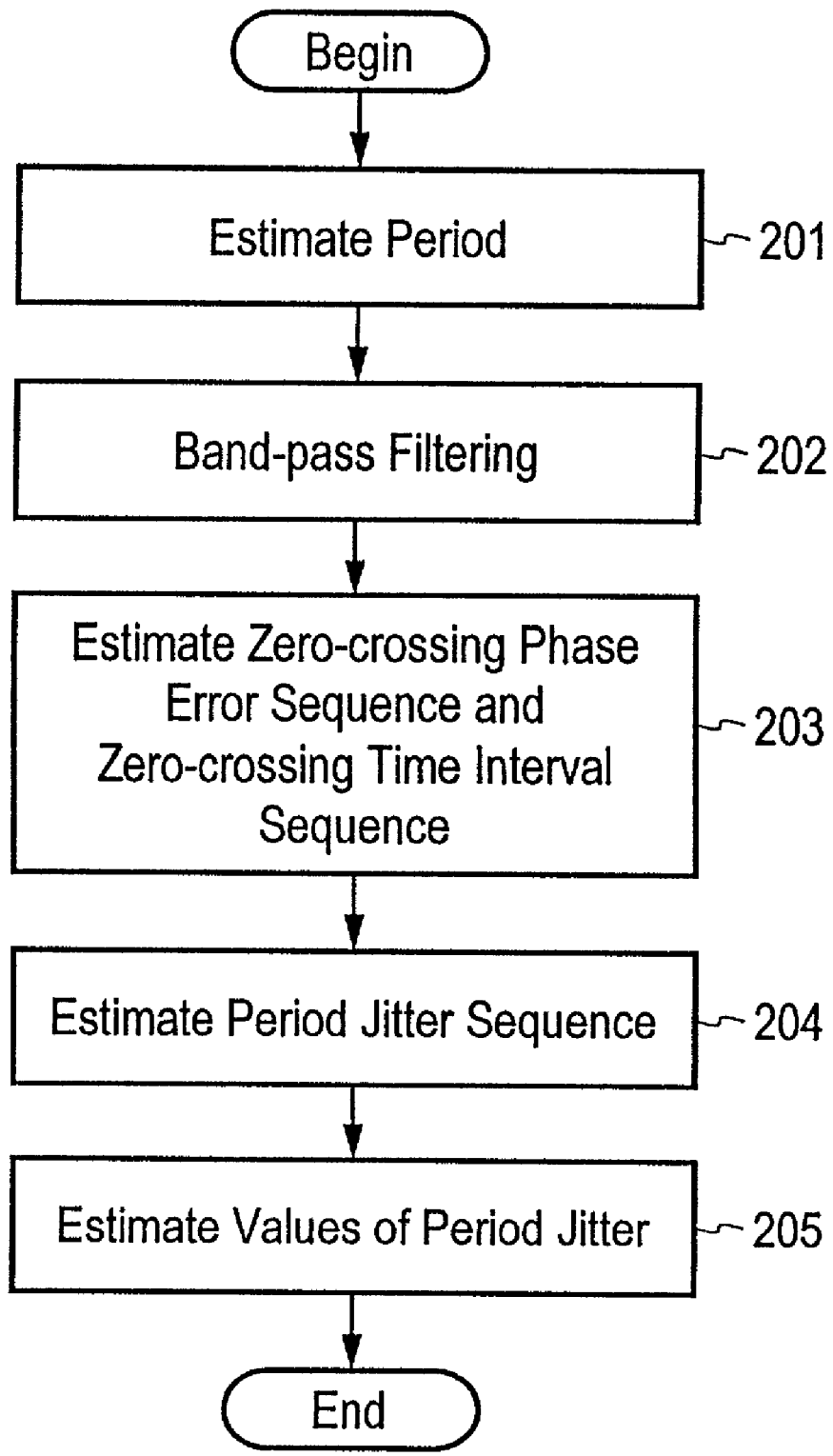
FIG. 24 is a flow-chart showing an example of jitter measurement method according to the present invention.

Next, the operation in the case where a jitter measurement of the signal under measurement is performed using the jitter measurement apparatus 100 according to the present invention will be explained below. FIG. 24 shows a processing procedure of a jitter measurement method according to the present invention. First, in step 201, the fundamental period estimator 101 obtains the fundamental period $T_0$ of the signal under measurement, and the fundamental period $T_0$ is stored in the memory 102. Next, in step 202, the band-pass filter 103 selectively passes therethrough the predetermined frequency components of the signal under measurement, i.e., frequency components around the fundamental frequency of the signal under measurement to band-limit the signal under measurement. Then, in step 203, the phase error estimator 104 estimates the sampling points (approximated zero-crossing points) $t[k]$ ($k=1, 2, 3, \ldots$) close to the corresponding zero-crossing points of the signal that has passed through the band-pass filter 103, and obtains the phase errors $\delta[k]$ between the approximated zero-crossing points and the corresponding zero-crossing points of the signal under measurement to obtain the zero-crossing phase error data sequence $\delta[k]$ and the zero-crossing time interval sequence $T_{k,k+1}$ between the corresponding approximated zero-crossing points. Next, in step 204, the period jitter estimator 105 estimates a period jitter sequence $J[k]$ using the equation (26) from the zero-crossing phase error data sequence $\delta[k]$ and the zero-crossing time interval sequence $T_{k,k+1}$ estimated by the zero-crossing phase error estimator 104 and the fundamental period $T_0$ stored in the memory 102. Finally, in step 205, the jitter detector 106 obtains the period jitter of the signal under measurement from the period jitter sequence $J[k]$, and the process ends.

When the fundamental period $T_0$ is stored in the memory in advance, the step 201 for obtaining the fundamental period $T_0$ of the signal under measurement can be omitted. In addition, a processing procedure shown in FIG. 36 or FIG. 38 may be used as the step 202 for band-limiting the signal under measurement. In addition, a processing procedure shown in FIG. 28 or FIG. 30 can be used as the step 203 for estimating the zero-crossing phase error data sequence. In addition, a processing procedure shown in FIG. 32 or FIG. 34 may be used as the step 204 for estimating the period jitter of the signal under measurement. In addition, in the step 205 for obtaining the period jitter of the signal under measurement, the peak-to-peak detector 107 obtains the peak-to-peak value of period jitter using the equation (29), the RMS detector 108 obtains the RMS value of period jitter using the equation (28), and the histogram estimator 109 obtains the histogram from the instantaneous period waveform data. In order to estimate the approximated zero-crossing points, as apparent from the explanation of "approximated zero-crossing point detection method" in the aforementioned section of summary of the invention, the signal to which a band-pass filtering process has been applied must be an over-sampled (sampling at a frequency equal to or higher than three times of the fundamental frequency) digital signal. If the output of the band-pass filter 103, i.e., the band-limited signal in the step 202 is an analog signal, the signal inputted to the phase error estimator 104 is converted into a digital signal within the phase error estimator 104, whereby the digital signal is processed. That is, in the step 203, the signal is processed after the input signal is converted into a digital signal.

Figure 25:
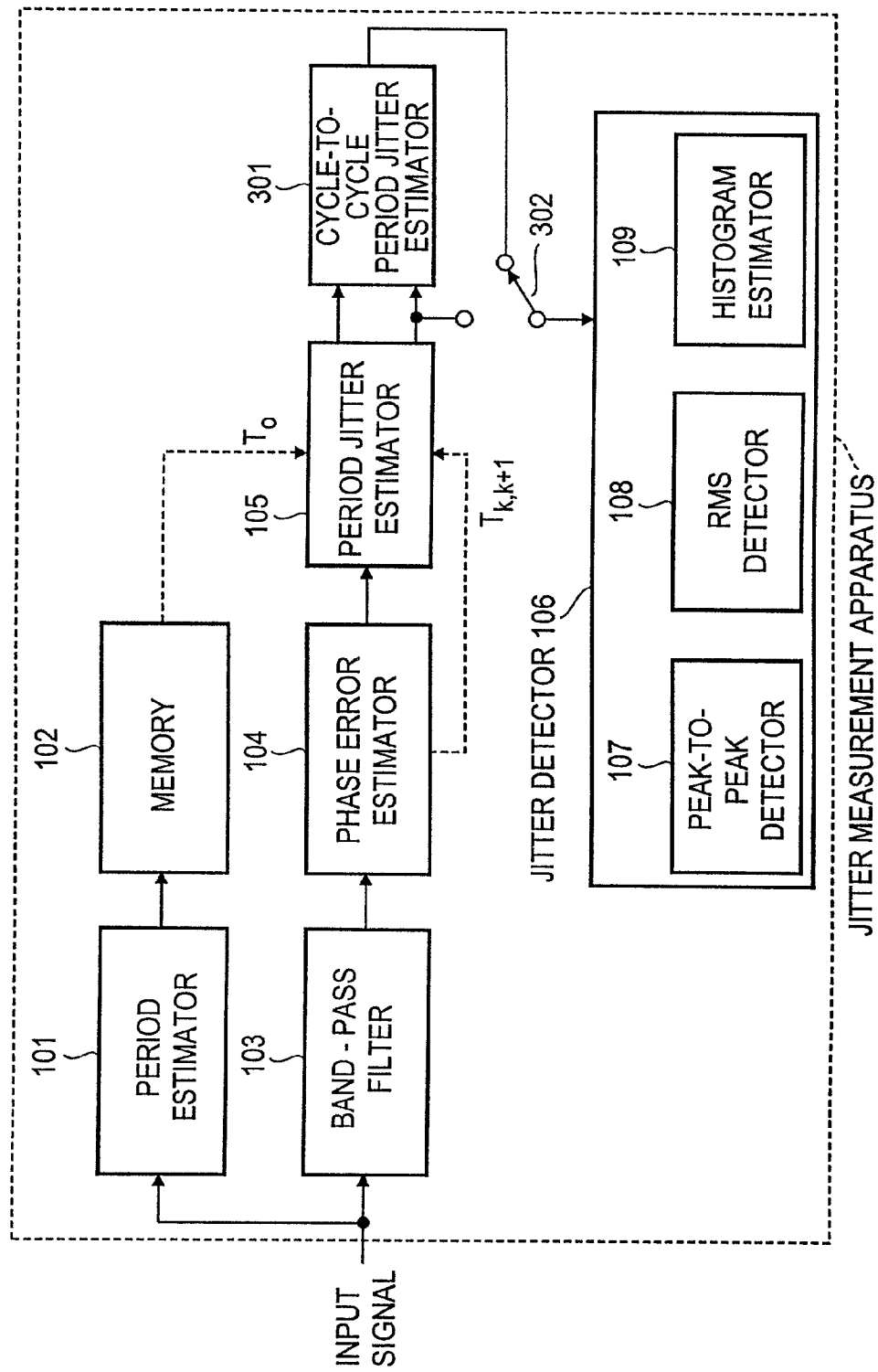
FIG. 25 is a diagram showing another example of functional configuration of a jitter measurement apparatus according to the present invention.

FIG. 25 shows another example of configuration of a jitter measurement apparatus used in the embodiment of the present invention. This jitter measurement apparatus 300 is same as the jitter measurement apparatus shown in FIG. 23 except that the jitter measurement apparatus 300 includes a cycle-to-cycle period jitter estimator 301 to which the period jitter sequence $J[k]$ is inputted for calculating a difference waveform using the equation (30) to output a cycle-to-cycle period jitter sequence $J_{CC}[k]$, and a switch 302 for selecting an output sequence from the period jitter estimator 105 or the cycle-to-cycle period jitter estimator 301. For simplicity, the explanation of the overlapped portion is omitted. In this case, the jitter detector 106 obtains a jitter value (a peak-to-peak value, an RMS value or a histogram) of the signal under measurement from the period jitter sequence $J[k]$ or the cycle-to-cycle period jitter sequence $J_{CC}[k]$.

Figure 26:
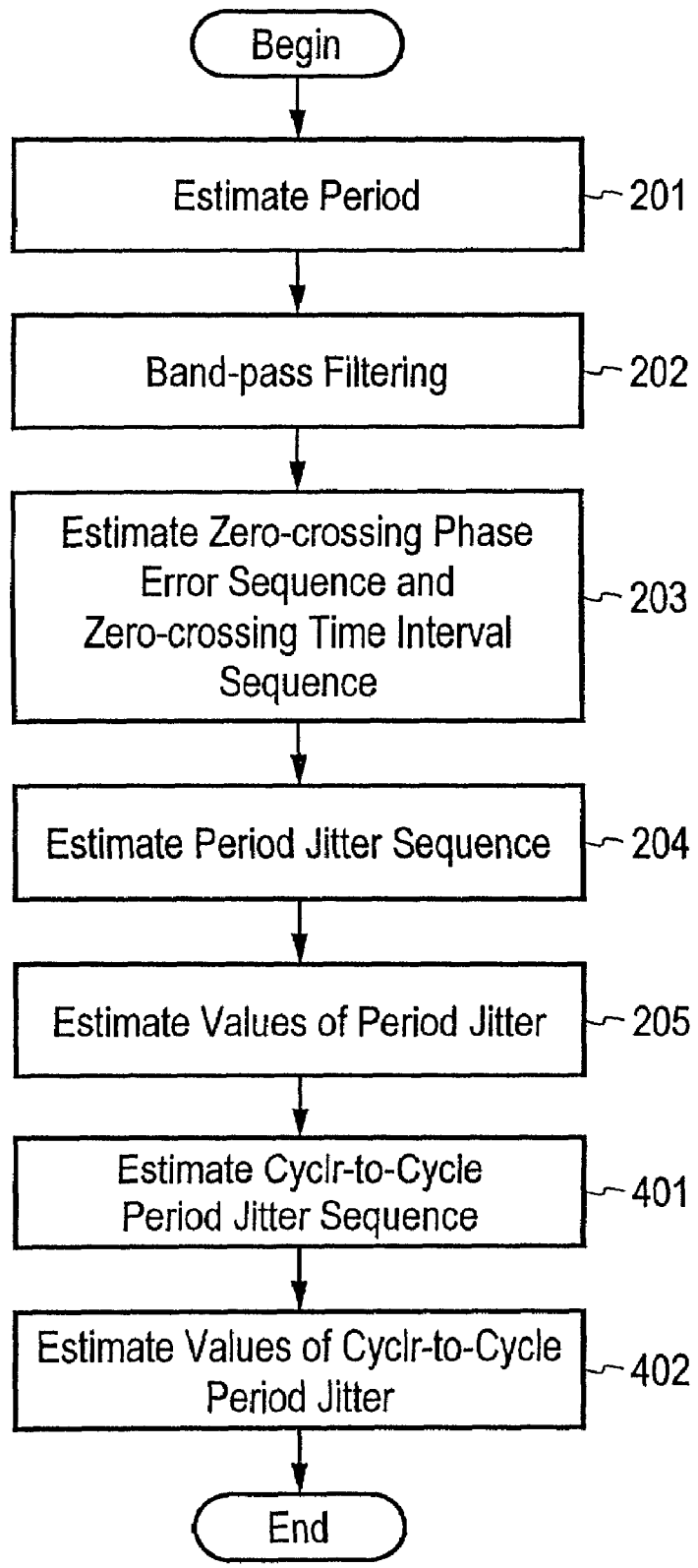
FIG. 26 is a flow-chart showing another example of jitter measurement method according to the present invention.

Next, the operation in the case where a jitter measurement of the signal under measurement is performed using the jitter measurement apparatus 300 according to the present invention will be explained below. FIG. 26 shows another processing procedure of a jitter measurement method according to the present invention. This jitter measurement method is same as the jitter measurement method shown in FIG. 24 except that this jitter measurement method includes: a step 401 for calculating, from the period jitter sequence $J[k]$ estimated by the period jitter estimator 105, a difference waveform of the period jitter sequence $J[k]$ by means of the cycle-to-cycle period jitter estimator 301, after the period jitter of the signal under measurement is obtained from the period jitter sequence $J[k]$, and for obtaining a cycle-to-cycle period jitter sequence $J_{CC}[k]$; and a step 402 for obtaining a cycle-to-cycle period jitter of the signal under measurement from the cycle-to-cycle period jitter sequence $J_{CC}[k]$ in the state that the jitter detector 106 connects the switch 302 to the cycle-to-cycle period jitter estimator 301 side. In this case, the explanation of the overlapped portion is omitted. In the step 402 for obtaining the cycle-to-cycle period jitter of the signal under measurement, the peak-to-peak detector 107 obtains a peak-to-peak value of cycle-to-cycle period jitter using the equation (32), the RMS detector 108 obtains an RMS value of cycle-to-cycle period jitter using the equation (31), and the histogram estimator 109 obtains a histogram from the cycle-to-cycle period jitter sequence.

The jitter measurement apparatus shown in FIG. 25 can also be constructed as an apparatus for estimating only cycle-to-cycle period jitter. In this case, the switch 302 for selecting a sequence can be omitted. Similarly, the jitter measurement method shown in FIG. 26 may also estimate only cycle-to-cycle period jitter. In this case, the step 205 for estimating the period jitter value from the period jitter sequence $\delta[k]$ can be omitted.

FIG. 27 shows an example of configuration of the phase error estimator 104 used in the jitter measurement apparatus 100. The phase error estimator 104 comprises: a zero-crossing sampler 501 to which a signal that has passed through the band-pass filter 103 is inputted for sampling only waveform data close to zero-crossing timings of the band-limited signal, and for outputting an approximated zero-crossing data sequence $x_{ZX}[k]=x(t[k])$ and a zero-crossing time interval sequence $T_{k,k+1}$ between the approximated zero-crossing points $t[k]$ and $t[k+1]$; and a phase error calculator 502 to which the approximated zero-crossing data sequence $x_{ZX}[k]$ is inputted for calculating phase errors $\delta[k]$ between the approximated zero-crossing points $t[k]$ and the corresponding zero-crossing points of the signal under measurement using the equation (18) or (20) from the approximated zero-crossing data $x_{ZX}[k]$, and for outputting a zero-crossing phase error data sequence $\delta[k]$.

Figure 28:
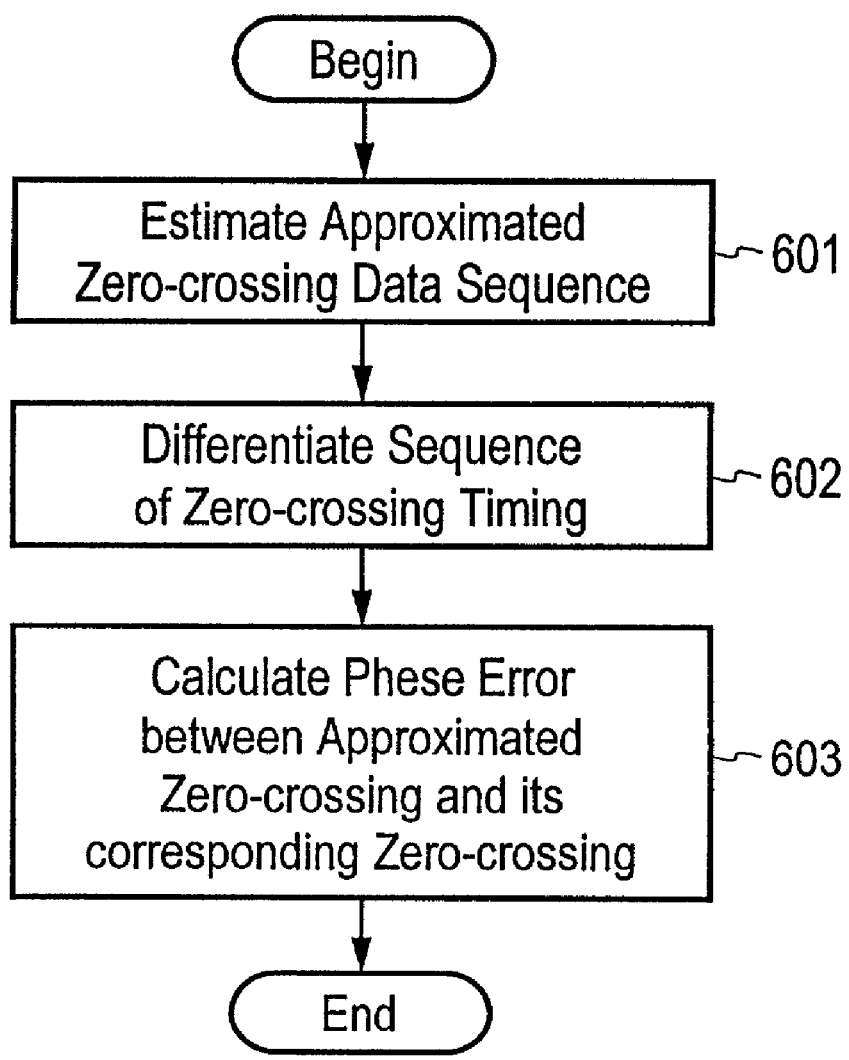
FIG. 28 is a flow-chart showing an example of the phase error estimation method in the step 203 in FIG. 24.

Next, FIG. 28 shows a processing procedure for estimating the phase errors between the zero-crossing points of the signal under measurement and the corresponding approximated zero-crossing points using the phase error estimator 104 according to the present invention. First, in step 601, the zero-crossing sampler 501 samples only the waveform data close to the zero-crossing timings of the signal that has passed through the band-pass filter 103 to obtain the approximated zero-crossing data sequence $x_{ZX}[k]=x(t[k])$. Next, in step 602, the zero-crossing sampler 501 obtains the approximated zero-crossing timing sequence $t[k]$ of zero-cross-sampled approximated zero-crossing data, and calculates a difference sequence of the approximated zero-crossing timing sequence $t[k]$ to obtain the zero-crossing time interval sequence $T_{k,k+1}=t[k+1]-t[k]$. Finally, in step 603, the phase error calculator 502 calculates the phase errors between the approximated zero-crossing points and the corresponding zero-crossing points of the signal under measurement from the approximated zero-crossing data sequence $x_{ZX}[k]$ obtained by the zero-crossing sampler 501, and outputs the zero-crossing phase error data sequence $\delta[k]$, and then the process ends. In the step 602 for obtaining the zero-crossing time interval sequence, the zero-crossing sampler 501 obtains the zero-crossing time interval $T_{k,k+1}$ between the approximated zero-crossing points using the equation (11). In addition, in the step 603 for obtaining the zero-crossing phase error data sequence, the phase error calculator 502 obtains the phase errors between the approximated zero-crossing points and the corresponding zero-crossing points using the equation (18) or (20). In the case of obtaining the phase errors using the equation (18) or (20), if the signal under measurement $x(t)$ is not a sine wave, it is necessary to make it a sine wave using the band-pass filter 103. Further, the amplitude A in the equations (18) and (20) is obtained by calculating a root-mean-square value of output samples of the band-pass filter 103 or by calculating one half of a difference between the maximum value and the minimum value of the output samples of the band-pass filter 103.

FIG. 29 shows another example of configuration of the phase error estimator 104 used in the jitter measurement apparatus 100. This phase error estimator 104 is same as the phase error estimator 104 shown in FIG. 27 except that this phase error estimator 104 includes an analytic signal transformer to which the signal that has passed through the band-pass filter 103 is inputted for transforming the band-limited signal into a complex analytic signal. In this case, the explanation of the overlapped portion is omitted. In this case, the analytic signal is inputted to the zero-crossing sampler 501, by which analytic signal waveform data around zero-crossing timings of a real part of the analytic signal are sampled, and an approximated zero-crossing complex data sequence $z(t[k])=x_{ZX}[k]+j\hat{x}_{ZX}[k]$ (equation (22)) is estimated. In addition, the phase error calculator 502 obtains a zero-crossing phase error data sequence $\delta[k]$ by calculating the equations (23) and (24) from the approximated zero-crossing complex data sequence.

Figure 30:
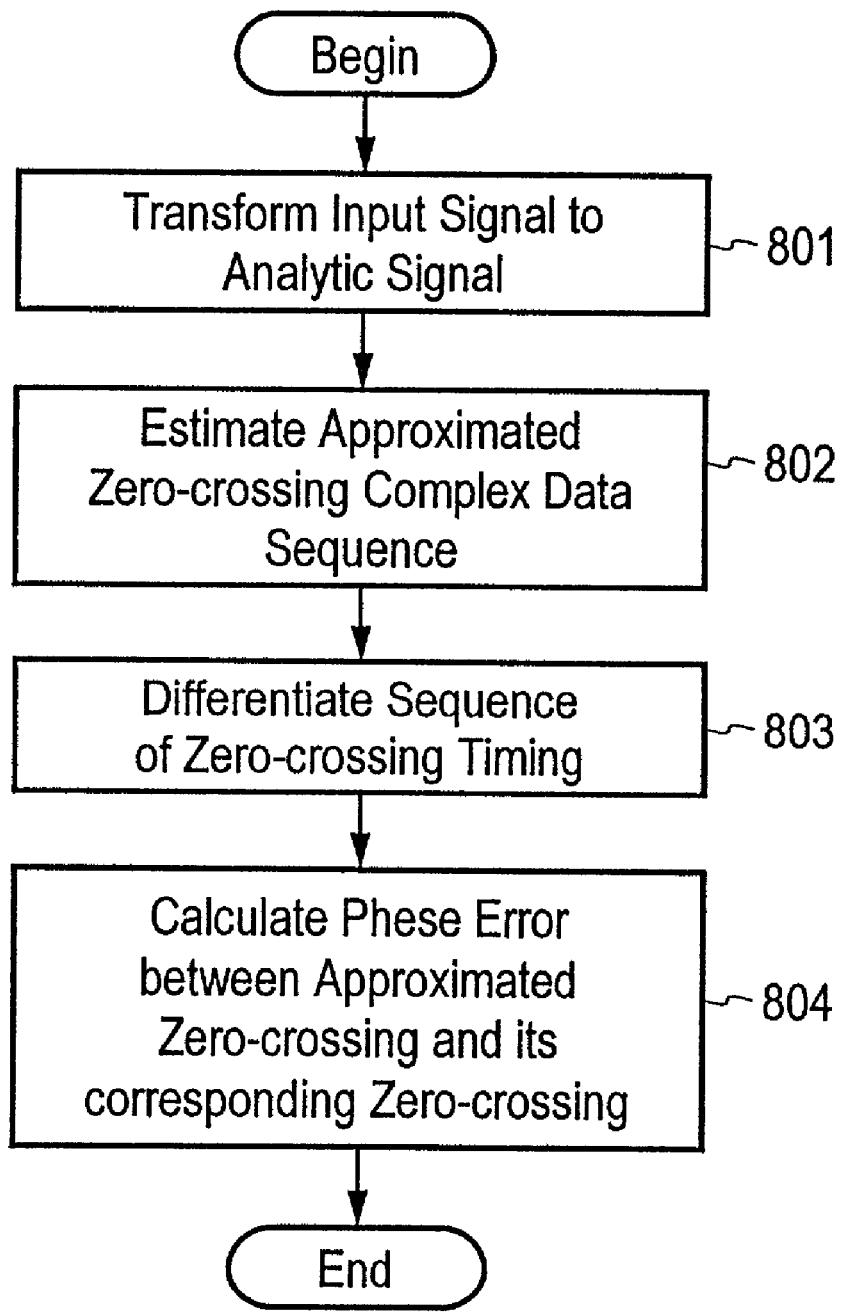
FIG. 30 is a flow-chart showing another example of the phase error estimation method in the step 203 in FIG. 24.

Next, a processing procedure for estimating the phase errors between the zero-crossing points of the signal under measurement and the corresponding approximated zero-crossing points using the phase error estimator 104 shown in FIG. 29 will be explained with reference to FIG. 30. First, in step 801, the analytic signal transformer 701 transforms the band-limited signal obtained from the band-pass filter 103 into a complex analytic signal $z(t)$. Next, in step 802, the zero-crossing sampler 501 samples the analytic signal waveform data close to the zero-crossing timings of the real part $x(t)$ of the analytic signal $z(t)$ transformed by the analytic signal transformer 701 to estimate the approximated zero-crossing complex data sequence $z(t[k])$. Next, in step 803, the zero-crossing sampler 501 obtains a timing sequence $t[k]$ of the sampled zero-crossing complex data, and calculates a difference sequence of the timing sequence $t[k]$ to obtain the zero-crossing time interval sequence $T_{k,k+1}=t[k+1]-t[k]$. Finally, in step 804, the phase error calculator 502 calculates the phase errors between the approximated zero-crossing points and the corresponding zero-crossing points of the signal under measurement from the approximated zero-crossing complex data sequence $z(t[k])$ obtained by the zero-crossing sampler 501, and obtains the zero-crossing phase error data sequence $\delta[k]$, and then the process ends.

In the step 801 for transforming the band-limited signal into a complex analytic signal $z(t)$, the analytic signal transformer 701 transforms an input signal into an analytic signal using Hilbert Transform or Fast Fourier Transform. In addition, in the step 803 for obtaining a zero-crossing time interval sequence, the zero-crossing sampler 501 obtains zero-crossing time intervals $T_{k,k+1}$ between the approximated zero-crossing points using the equation (11). In addition, in the step 804 for obtaining a zero-crossing phase error data sequence, the phase error calculator 502 obtains the instantaneous phases $\phi[k]$ of the approximated zero-crossing points using the equation (23), and obtains the phase errors $\delta[k]$ between the approximated zero-crossing points and the corresponding zero-crossing points using the equation (24) or (25).

FIG. 31 shows an example of configuration of the period jitter estimator 105 used in the jitter measurement apparatus 100. This period jitter estimator 105 comprises: an instantaneous phase estimator 901 for obtaining an instantaneous period sequence $T[k]$ of the signal under measurement from the zero-crossing phase error data sequence $\delta[k]$, the zero-crossing time interval sequence $T_{k,k+1}$, and the fundamental period $T_0$ of the signal under measurement; a fundamental period subtractor 902 for obtaining a difference between each instantaneous period value $T[k]$ estimated by the instantaneous period estimator 901 and the fundamental period $T_0$, and for outputting a period jitter sequence (uncorrected period jitter sequence); a period jitter sequence corrector 903 for correcting the period jitter sequence, which is estimated using difference formula, by multiplying the period jitter sequence (uncorrected period jitter sequence) by a ratio $(T_0/T_{k,k+1})$ of the fundamental period $T_0$ and the zero-crossing time interval $T_{k,k+1}$.

Figure 32:
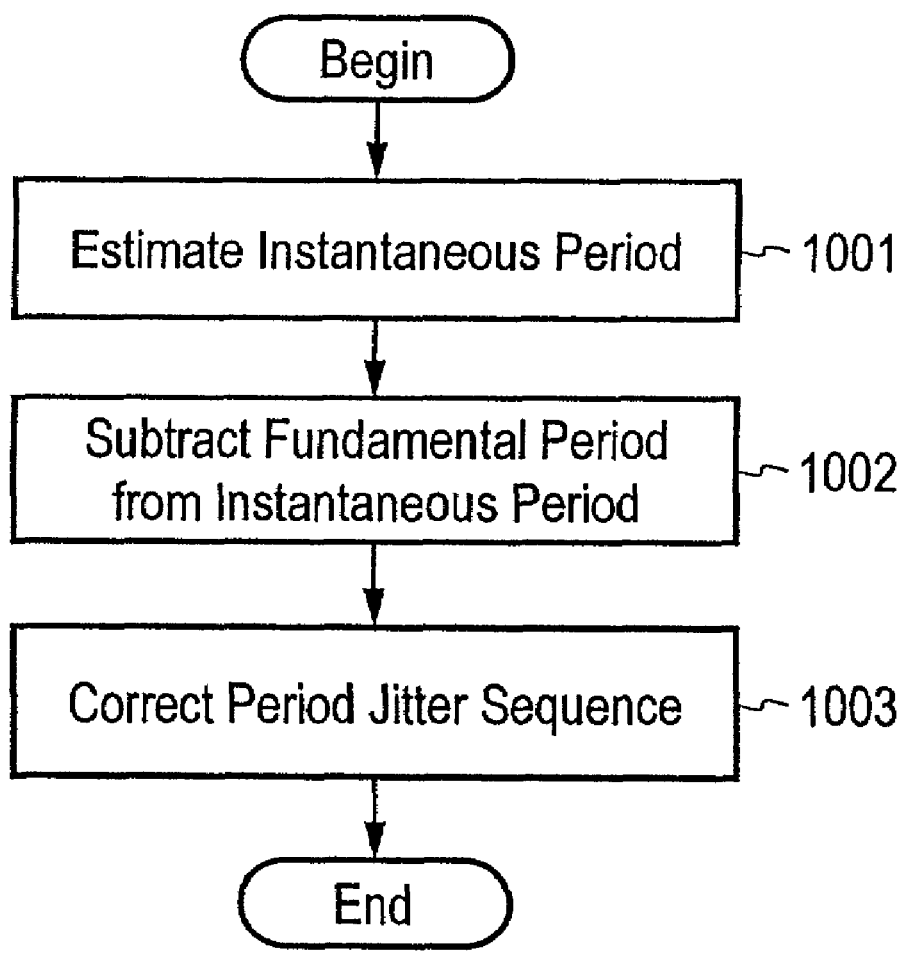
FIG. 32 is a flow-chart showing an example of the period jitter estimation method in the step 204 in FIG. 24.

Next, the operation in the case of performing a period jitter estimation of the signal under measurement using this period jitter estimator 105, i.e., a processing procedure of the period jitter estimation method will be explained with reference to FIG. 32. First, in step 1001, the instantaneous period estimator 901 obtains an instantaneous period sequence $T[k]$ from the zero-crossing phase error data sequence $\delta[k]$ estimated by the zero-crossing phase error estimator 104, the zero-crossing time interval sequence $T_{k,k+1}$ obtained from the zero-crossing sampler 501, and the fundamental period $T_0$ of the signal under measurement stored in the memory 102. Next, in step 1002, the fundamental period subtractor 902 calculates a difference between each instantaneous period value $T[k]$ estimated by the instantaneous period estimator 901 and the fundamental period $T_0$ to obtain a period jitter sequence. Finally, in step 1003, the period jitter sequence corrector 903 corrects the period jitter sequence, which is estimated using difference formula, by multiplying the period jitter sequence obtained by the fundamental period subtractor 902 by a ratio ($T_0/T_{k,k+1}$) of the fundamental period and the zero-crossing time interval, and then the process ends. In the step 1001 for obtaining the instantaneous period sequence T[k] of the signal under measurement, the instantaneous period estimator 901 obtains the instantaneous period T[k] using the equation (27).

FIG. 33 shows another example of configuration of the period jitter estimator 105 used in the jitter measurement apparatus 100. This period jitter estimator 105 comprises: an instantaneous angular frequency estimator 1001 to which the zero-crossing phase error data sequence $\delta[k]$ is inputted for obtaining an instantaneous angular frequency sequence $\omega[k]$ by a calculation of the equation (10) from the sampling intervals $T_{k,k+1}$ of the approximated zero-crossing data sequence and the zero-crossing phase error data $\delta[k]$; and a period jitter calculator 1102 for obtaining a period jitter sequence J[k] by a calculation of the equation (9) from the instantaneous angular frequency sequence $\omega[k]$ and the fundamental period $T_0$.

Figure 34:
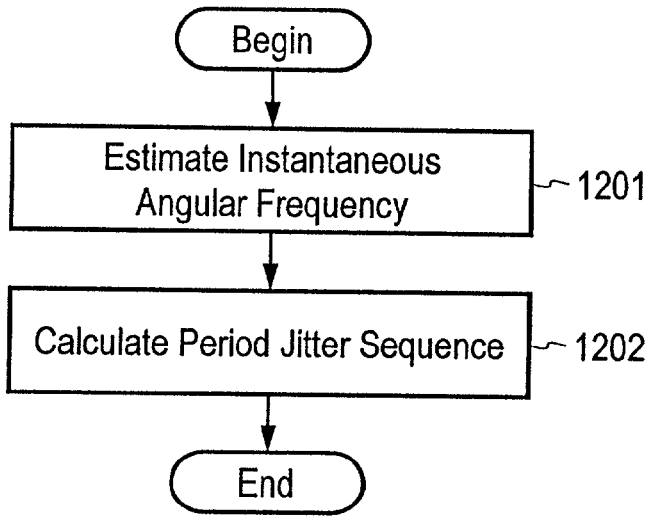
FIG. 34 is a flow-chart showing another example of the period jitter estimation method the step 204 in FIG. 24.

Next, the operation in the case of performing a period jitter estimation of the signal under measurement using this period jitter estimator 105 shown in FIG. 33 will be explained. FIG. 34 shows a processing procedure of this period jitter estimation method. First, in step 1201, the instantaneous angular frequency estimator 1101 obtains the instantaneous angular frequency sequence $\omega[k]$ of the signal under measurement from the zero-crossing phase error data $\delta[k]$ estimated by the zero-crossing phase error estimator 104 and the zero-crossing time interval sequence $T_{k,k+1}$ obtained from the zero-crossing sampler 501. Next, in step 1202, the period jitter calculator 1102 obtains the period jitter sequence J[k] of the signal under measurement from the instantaneous angular frequency sequence $\omega[k]$ obtained from the instantaneous angular frequency estimator 1101 and the fundamental period $T_0$ stored in the memory 102, and the process ends. In the step 1201 for obtaining the instantaneous angular frequency sequence $\omega[k]$ of the signal under measurement, the instantaneous angular frequency estimator 1101 obtains the instantaneous angular frequency using the equation (10). In addition, in the step 1202 for obtaining the period jitter J[k] of the signal under measurement from the instantaneous angular frequency sequence $\omega[k]$, the period jitter calculator 1102 obtains the period jitter sequence J[k] using the equation (9).

FIG. 35 shows an example of configuration of the band-pass filter 103 used in the jitter measurement apparatus 100. This band-pass filter 103 comprises: a time domain to frequency domain transformer 1301 for transforming the signal under measurement into a signal in frequency domain; a bandwidth limiter 1302 for extracting only components around the fundamental frequency of the signal under measurement from the output of the time domain to frequency domain transformer 1301; and a frequency domain to time domain transformer 1303 for inverse-transforming the output of the bandwidth limiter 1302 into a signal in time domain. The time domain to frequency domain transformer 1301 and the frequency domain to time domain transformer 1303 may be packaged using FFT and inverse FFT, respectively.

Figure 36:
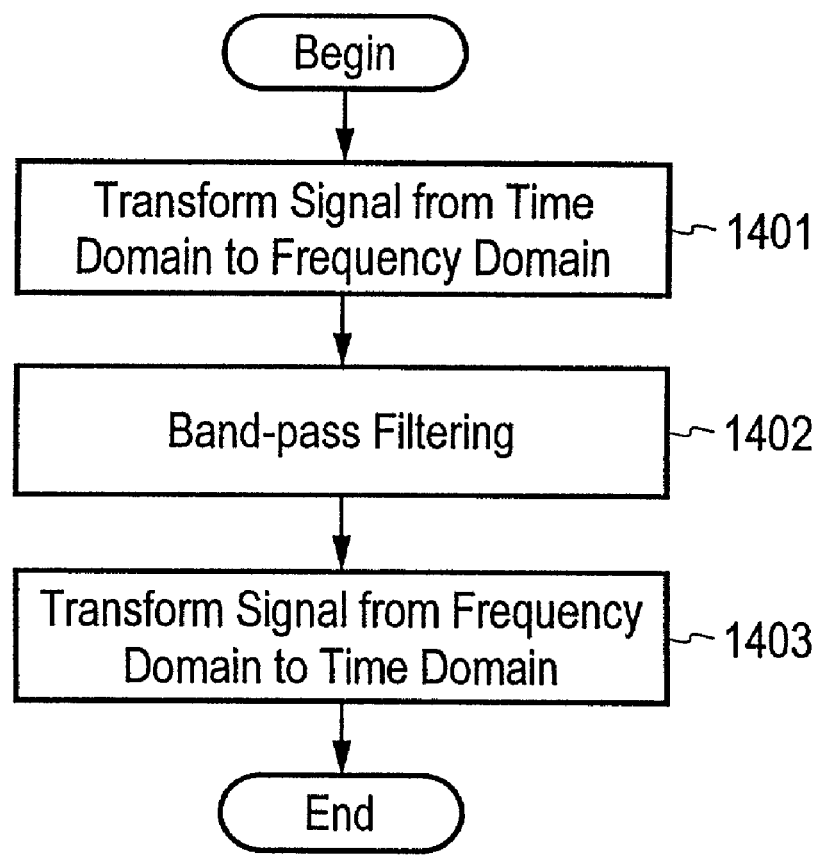
FIG. 36 is a flow-chart showing an example of the band-pass filtering method in the step 202 in FIG. 24.

Next, the operation in the case of performing a band-limitation of the signal under measurement using this band-pass filter 103 shown in FIG. 35 will be explained. FIG. 36 shows a processing procedure of this band-limitation method. First, in step 1401, the time domain to frequency domain transformer 1301 applies FFT to the signal under measurement to transform a signal in time domain into a signal in frequency domain. Next, in step 1402, the bandwidth limiter 1302 retains the components around the fundamental frequency of the signal under measurement in the transformed signal in frequency domain, and replaces the other frequency components with zero to band-limit the signal in frequency domain. Finally, in step 1403, the frequency domain to time domain transformer 1303 applies inverse FFT to the band-limited signal in frequency domain to transform the signal in frequency domain into a signal in time domain, and the process ends.

FIG. 37 shows another example of configuration of the band-pass filter 103 used in the jitter measurement apparatus 100. This band-pass filter 103 comprises: a buffer memory 1501 for storing therein the signal under measurement; a data selector 1502 for extracting the signal in the sequential order from the buffer memory 1501 such that the signal being extracted is partially overlapped with the signal extracted just before; a window function multiplier 1503 for multiplying each extracted partial signal by a window function; a time domain to frequency domain transformer 1504 for transforming each partial signal multiplied by the window function into a signal in frequency domain; a bandwidth limiter 1505 for extracting only components around the fundamental frequency of the signal from the signal transformed in frequency domain; a frequency domain to time domain transformer 1506 for inverse-transforming the output of the bandwidth limiter 1505 into a signal in time domain; and an amplitude corrector 1507 for multiplying the signal transformed in time domain by an inverse number of the window function to obtain a band-limited analytic signal. The time domain to frequency domain transformer 1504 and the frequency domain to time domain transformer 1506 may be packaged using FFT and inverse FFT, respectively.

Figure 38:
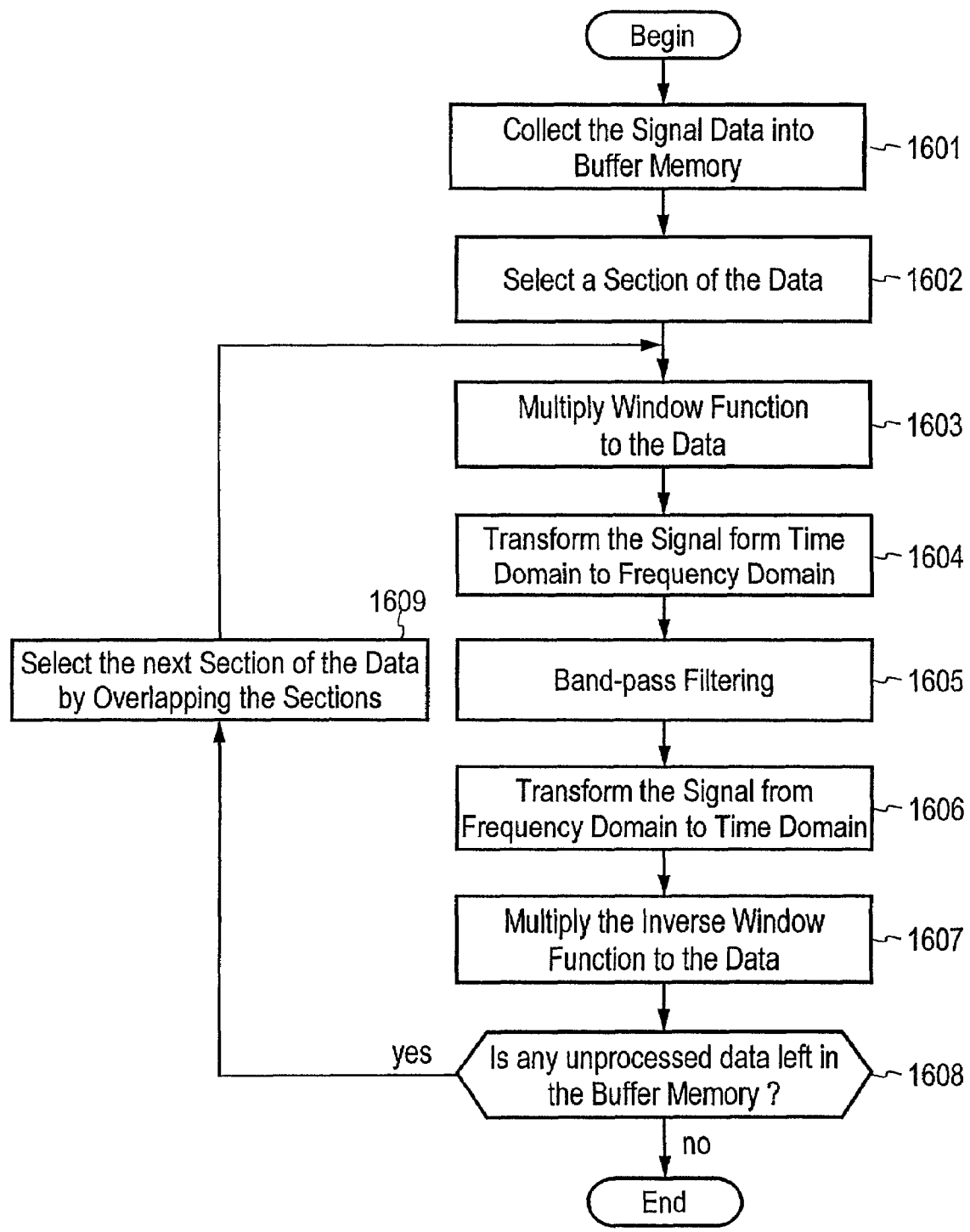
FIG. 38 is a flow-chart showing another example of the band-pass filtering method in the step 202 in FIG. 24.

Next, the operation in the case of performing the band-limitation of the signal under measurement using this band-pass filter 103 will be explained. FIG. 38 shows a processing procedure of this band-limitation method. First, in step 1601, the buffer memory 1501 stores therein the signal under measurement. Next, in step 1602, the data selector 1502 extracts a portion of the stored signal from the buffer memory 1501. Next, in step 1603, the window function multiplier 1503 multiplies the extracted partial signal by the window function. Next, in step 1604, the time domain to frequency domain transformer 1504 applies FFT to the partial signal multiplied by the window function to transform the signal in time domain into a signal in frequency domain. Next, in step 1605, the bandwidth limiter 1505 retains only components around the fundamental frequency of the signal under measurement in the transformed signal in frequency domain, and replaces the other frequency components with zeros to band-limit the signal in frequency domain. Then in step 1606, the frequency domain to time domain transformer 1506 applies inverse FFT to the band-limited signal in frequency domain to transform the signal in frequency domain into a signal in time domain. Next, in step 1607, the amplitude corrector 1507 multiplies the inverse-transformed signal in time domain by an inverse number of the window function multiplied in the step 1603 to obtain a band-limited signal. Finally, in step 1608, a check is made to see if there is unprocessed data remaining in the buffer memory. If there is unprocessed data remaining in the buffer memory, the data selector 1502 extracts, in step 1609, the signal in the sequential order from the buffer memory 1501 such that the signal being extracted is partially overlapped with the signal extracted just before, and thereafter the steps 1603, 1604, 1605, 1606, 1607 and 1608 are repeated. If there is no unprocessed data, the process ends.

The band-pass filter 103 shown in FIG. 37 and the band-pass filtering process shown in FIG. 38 are modified versions of the band-pass filter 103 shown in FIG. 35 and the band-pass filtering process shown in FIG. 36, respectively. This modification is made to perform a real time processing of the band-pass filter 103 shown in FIG. 35 and the band-pass filtering process shown in FIG. 36. Each of the band-pass filters 103 shown in FIGS. 35 and 37 commonly has a time domain to frequency domain transformer, a bandwidth limiter and a frequency domain to time domain transformer, and each of the band-pass filtering processes shown in FIGS. 36 and 38 commonly includes a time domain to frequency domain transformation step, a bandwidth limitation step and a frequency domain to time domain transformation step.

Figure 39A:
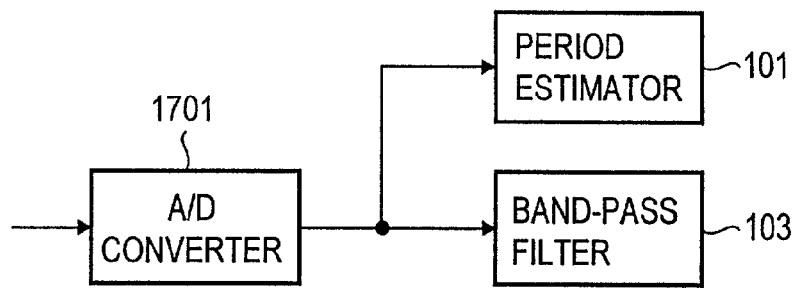
FIG. 39A is a diagram showing another configuration example of the input portion of a signal under measurement of a jitter measurement apparatus according to the present invention.

In the jitter measurement apparatus shown in FIGS. 23 and 25, as shown in FIG. 39A, an analog signal under measurement may be digitized and converted to a digital signal by the AD converter 1701, and then the digitized signal may be supplied to the period estimator 101 and the band-pass filter 103. It is desirable that a high-speed AD converter, a high-speed digitizer or a high-speed digital sampling oscilloscope is used as the AD converter 1701.

Figure 40:
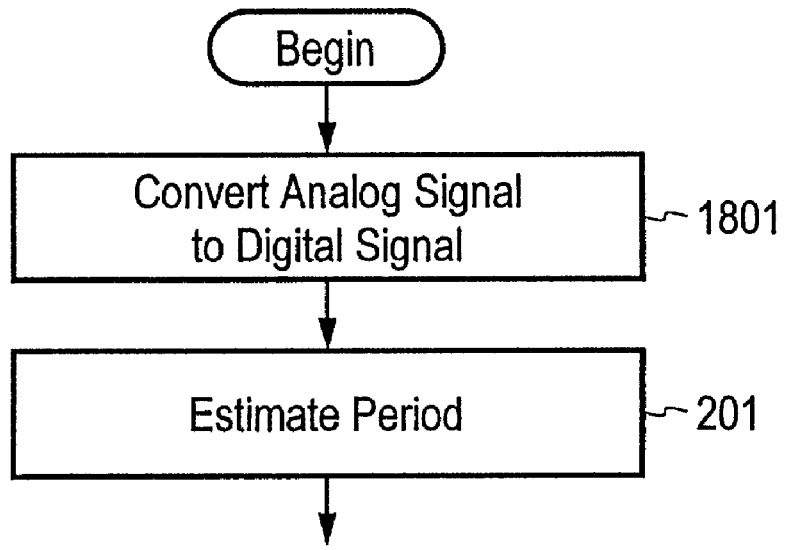
FIG. 40A is a flow-chart showing a processing procedure of the input portion shown in FIG. 39A.
FIG. 40B is a flow-chart showing a processing procedure of the input portion shown in FIG. 39B.
Figure 40:
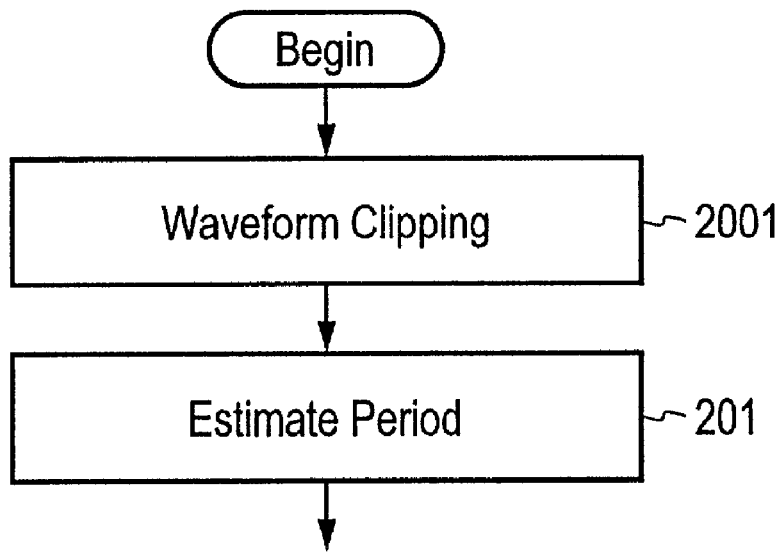

Regarding the jitter measurement method corresponding to this, prior to the estimation of the fundamental period $T_0$ in the step 201 in FIGS. 24 and 26, it is sufficient to sample (digitize) the analog signal under measurement and to convert the sampled signal to a digital signal in step 1801 as shown in FIG. 40A.

Figure 39B:
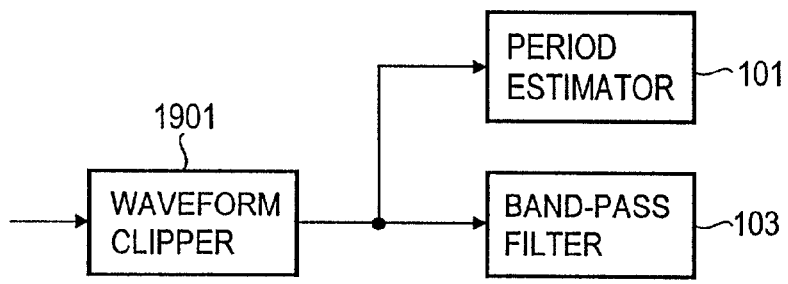
FIG. 39B is a diagram showing further another configuration example of the input portion.
Figure 39C:
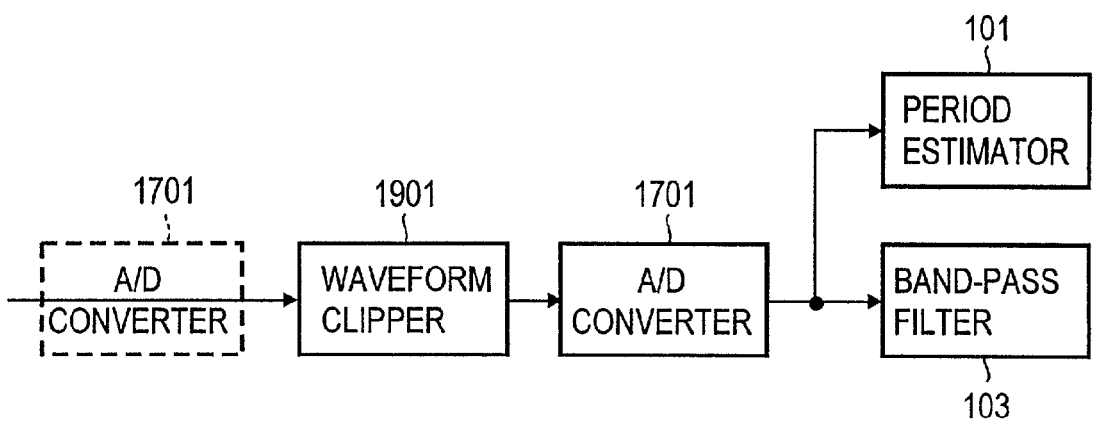
FIG. 39C is a diagram showing further another configuration example of the input portion.

In the jitter measurement apparatus shown in FIGS. 23 and 25, as shown in FIG. 39B, amplitude modulation components may be removed from the analog signal under test by the waveform clipper 1901 so that the signal is in the state that the phase modulation components are retained, and then the >signal may be supplied to the period estimator 101 and the band-pass filter 103.

Regarding the jitter measurement method corresponding to this, prior to the estimation of the fundamental period $T_0$ in the step 201 in FIGS. 24 and 26, it is sufficient to remove, in step 2001 as shown in FIG. 40B, the amplitude modulation components from the input signal so that it is in the state that the phase modulation components are retained.

As shown in step 39C, the AD converter 1701 may be provided at the rear stage or at the front stage of the waveform clipper 1901 so that the amplitude modulation components of the analog signal under measurement are removed from the signal, and the analog signal under measurement is converted into a digital signal, and then the digital signal is supplied to the period estimator 101 and the band-pass-filter 103. Although not shown, in the jitter measurement method according to the present invention, the fundamental period $T_0$ of the signal under measurement may be similarly estimated after the amplitude modulation components of the signal under measurement are removed and the signal under measurement is converted into a digital signal. In this case, either of the removing process of the amplitude modulation components and the analog to digital conversion process may be performed first.

Figure 41:
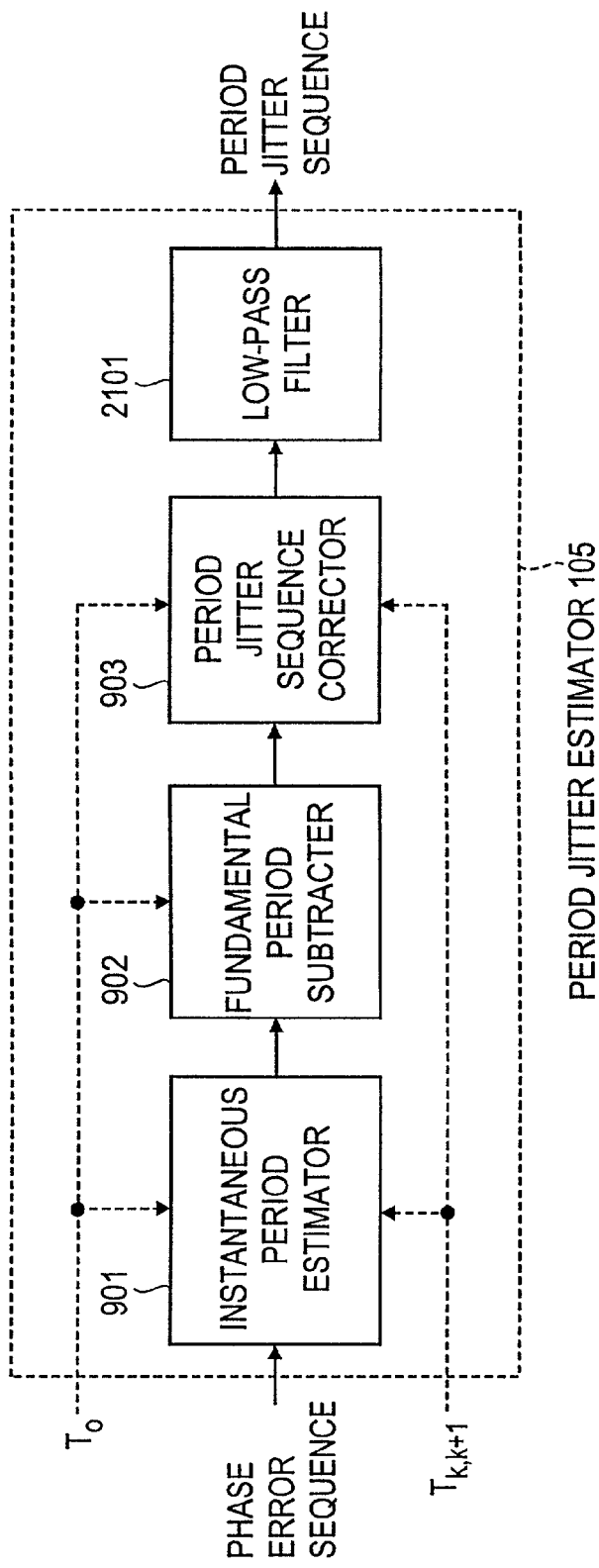
FIG. 41 is a diagram showing further another example of the period jitter estimator 105 in FIG. 23.

FIG. 41 shows further another example of configuration of the period jitter estimator 105 used in the embodiment of the present invention. This period jitter estimator 105 is same as the period jitter estimator 105 shown in FIG. 31 except that this period jitter estimator 105 includes a low-pass filter 2101 for removing high frequency components from the estimated period jitter sequence outputted by the period jitter sequence corrector 903. In this case, the explanation of the overlapped portion is omitted.

Figure 42:
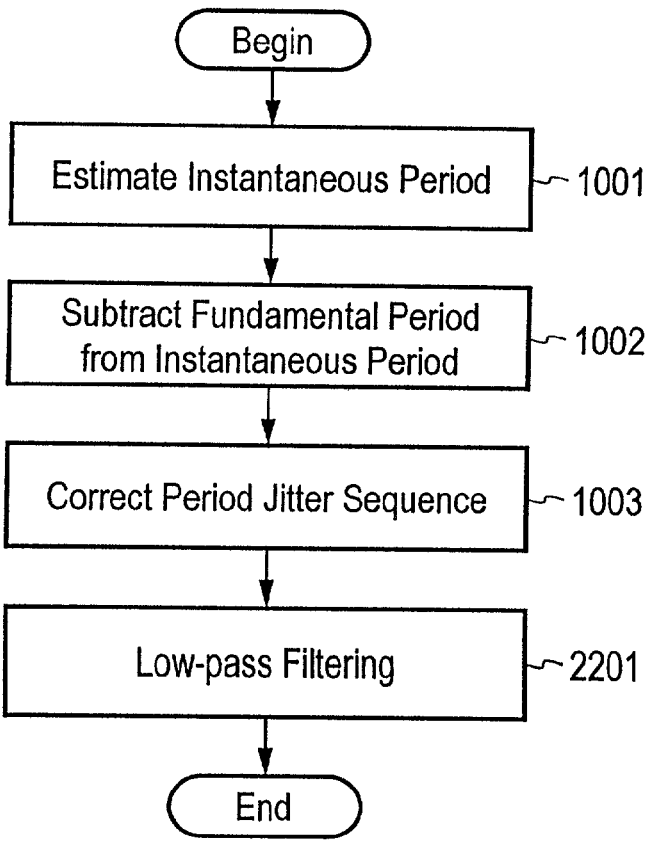
FIG. 42 is a flow-chart showing further another example of the period jitter estimation method in the step 204 in FIG. 24.

FIG. 42 shows a processing procedure of a period jitter estimation method corresponding to the period jitter sequence estimator 105 shown in FIG. 41. This period jitter estimation method is same as the period jitter estimation method shown in FIG. 32 except that this period jitter estimation method includes, in the final step, a step 2201 in which the low-pass filter 2101 removes high frequency components from the period jitter sequence.

As shown in FIGS. 41 and 42, the removal of the high frequency components by the low-pass filter 2101 is intended to remove the components close to a high-frequency noise component like the fundamental frequency $1/T_0$ of the signal under measurement, and hence the cut-off frequency is, for example, ½ of the fundamental frequency, i.e., $1/(2T_0)$ or so.

The low-pass filter 2101 can also be built, as indicated by dashed lines in FIG. 33, in the period jitter estimator 105. In this case, the processing procedure of the period jitter estimation method shown in FIG. 34 includes, in the final stage of the process, a step of removing high-frequency components of a period jitter sequence using the low-pass filter.

In the above description, if the signal under measurement is a signal close to a sine wave, the band-pass filter 103 and the band-pass filtering process 202 may be omitted.

In FIGS. 23 and 25, the jitter detector 106 may include at least one of the peak-to-peak detector 107, the RMS detector 108 and the histogram estimator 109. Similarly, in FIGS. 24 and 26, each of the period jitter value estimation process and the cycle-to-cycle period jitter value estimation process may include at least one of the peak-to-peak detection process, the root-mean-square process and the histogram estimation process.

The jitter measurement apparatus according to the present invention shown in FIGS. 23 and 24 may be functioned by the execution of programs in a computer.

According to the jitter measurement apparatus and the jitter measurement method according to the present invention, the estimation accuracy in the case where the signal under measurement is digitized at low over-sampling rate can be improved. Therefore, the accuracy of jitter measurement using the conventional $\Delta\phi$ method can greatly be improved.

What is claimed is:

1. An apparatus for measuring a jitter of a signal under measurement comprising:
   a phase error estimator for obtaining sampling points close to corresponding zero-crossing points of the signal under measurement as approximated zero-crossing points, for obtaining phase errors between the approximated zero-crossing points and the corresponding zero-crossing points of the signal under measurement as a zero crossing phase error data sequence, and for obtaining time intervals between adjacent approximated zero-crossing points as a zero-crossing time interval sequence; and
   a period jitter estimator for obtaining a period jitter sequence of the signal under measurement from the zero-crossing phase error data sequence, the zero-crossing time interval sequence and a fundamental period of the signal under measurement.

2. The apparatus for measuring a jitter of a signal under measurement according to claim 1 further comprising band-pass filter means provided at front stage of said phase error estimator to which the signal under measurement is inputted for passing therethrough predetermined frequency components of the signal under measurement, and for supplying the predetermined frequency components to said phase error estimator.

3. The apparatus for measuring a jitter of a signal under measurement according to claim 2 further comprising a cycle-to-cycle period jitter estimator to which the period jitter sequence is inputted for calculating its difference sequence, and for outputting a cycle-to-cycle period jitter sequence.

4. The apparatus for measuring a jitter of a signal under measurement according to claim 2 or 3 further comprising a jitter detector to which the jitter sequence is inputted for obtaining a jitter value of the signal under measurement from the jitter sequence.

5. The apparatus for measuring a jitter of a signal under measurement according to claim 2 or 3 wherein said phase error estimator comprises:
   a zero-crossing sampler to which the signal under measurement that has passed through said band-pass filter means is inputted for sampling only waveform data around zero-crossing timings of the inputted signal, and for outputting an approximated zero-crossing data sequence and the zero-crossing time interval sequence between the approximated zero-crossing points; and
   a phase error calculator for outputting the zero-crossing phase error data sequence by calculating the phase errors between the approximated zero-crossing points and the corresponding zero-crossing points of the signal under measurement.

6. The apparatus for measuring a jitter of a signal under measurement according to claim 5 wherein said phase error estimator further comprising
   an analytic signal transformer to which the signal under measurement that has passed through said band-pass filter means is inputted for transforming the inputted signal under measurement into a complex analytic signal, and for supplying the complex analytic signal to said zero-crossing sampler.

7. The apparatus for measuring a jitter of a signal under measurement according to claim 2 or 3 wherein said period jitter estimator comprises:
   an instantaneous period estimator for obtaining an instantaneous period sequence of the signal under measurement from the zero-crossing phase error data sequence, the zero-crossing time interval sequence between the approximated zero-crossing points, and the fundamental period of the signal under measurement;
   a fundamental period subtractor for obtaining respective differences between the instantaneous periods and the fundamental period of the signal under measurement, and for outputting an uncorrected period jitter sequence; and
   a period jitter sequence corrector for multiplying the uncorrected period jitter sequence by a ratio of the fundamental period of the signal under measurement and the intervals between the zero-crossing points to perform a correction, and to obtain the period jitter sequence.

8. The apparatus for measuring a jitter of a signal under measurement according to claim 2 or 3 wherein said period jitter estimator comprising:
   an instantaneous angular frequency estimator to which the zero-crossing phase error data sequence is inputted for obtaining an instantaneous angular frequency sequence of the signal under measurement from intervals of the approximated zero-crossing points and from the zero-crossing phase error data; and
   a period jitter calculator for obtaining the period jitter sequence from the instantaneous angular frequency sequence and the fundamental period.

9. The apparatus for measuring a jitter of a signal under measurement according to claim 2 or 3 wherein said band-pass filter comprising:
   a time domain to frequency domain transformer for transforming the signal under measurement into a signal in frequency domain;
   a bandwidth limiter for extracting only components around a fundamental frequency of the signal under measurement from an output of said time domain to frequency domain transformer; and
a frequency domain to time domain transformer for inverse-transforming an output of said bandwidth limiter into a signal in time domain.

10. The apparatus for measuring a jitter of a signal under measurement according to claim 2 or 3 further comprising a waveform clipper to which the signal under measurement is inputted for removing amplitude modulation components of the signal under measurement in the state that phase modulation components of the signal under measurement are retained.

11. The apparatus for measuring a jitter of a signal under measurement according to claim 4 wherein said jitter detector is a peak-to-peak detector for obtaining a difference between the maximum value and the minimum value of a supplied jitter sequence.

12. The apparatus for measuring a jitter of a signal under measurement according to claim 4 wherein said jitter detector is an RMS detector for obtaining a root-mean-square value (RMS value) of a supplied jitter sequence.

13. The apparatus for measuring a jitter of a signal under measurement according to claim 4 wherein said jitter detector is a histogram estimator for obtaining a histogram of a supplied jitter sequence.

14. The apparatus for measuring a jitter of a signal under measurement according to claim 2 or 3 further comprising a fundamental period estimator to which the signal under measurement is inputted for obtaining a fundamental period of the signal under measurement.

15. The apparatus for measuring a jitter of a signal under measurement according to claim 7 wherein said period jitter estimator further comprising a low-pass filter to which the period jitter sequence is inputted for removing high-frequency components of the period jitter sequence.

16. The apparatus for measuring a jitter of a signal under measurement according to claim 8 wherein said period jitter estimator further comprising a low-pass filter to which the period jitter sequence is inputted for removing high-frequency components of the period jitter sequence.

17. A method of measuring a jitter of a signal under measurement comprising:
   a step of passing predetermined frequency components of the signal under measurement to obtain a band-limited signal;
   a step of estimating a zero-crossing phase error data sequence by obtaining sampling points close to corresponding zero-crossing points of the band-limited signal as approximated zero-crossing points and by calculating phase errors between the approximated zero-crossing points and the corresponding zero-crossing points of the band-limited signal;

a step of obtaining a zero-crossing time interval sequence by calculating time intervals between adjacent approximated zero-crossing points; and a step of obtaining a period jitter sequence of the signal under measurement from the zero-crossing phase error data sequence, the zero-crossing time interval sequence and a fundamental period of the signal under measurement.

18. The method of measuring a jitter of a signal under measurement according to claim 17 further including a step of calculating a difference sequence of the period jitter sequence to obtain a cycle-to-cycle period jitter sequence of the signal under measurement.

19. The method of measuring a jitter of a signal under measurement according to claim 17 or 18 further including a step of obtaining a jitter value of the signal under measurement from the jitter sequence.

20. The method of measuring a jitter of a signal under measurement according to claim 17 or 18 wherein said step of estimating the zero-crossing phase error data sequence comprises:

a step of sampling waveform data around zero-crossing timings of the band-limited signal to obtain an approximated zero-crossing data sequence; and a step of calculating phase errors between the approximated zero-crossing points and the corresponding zero-crossing points of the signal under measurement from the approximated zero-crossing data sequence.

21. The method of measuring a jitter of a signal under measurement according to claim 17 or 18 wherein said step of estimating the zero-crossing phase error data sequence comprises:

a step of transforming the band-limited signal into a complex analytic signal;

a step of sampling analytic signal waveform data close to zero-crossing timings of a real part of the complex analytic signal to estimate an approximated zero-crossing complex data sequence; and a step of calculating phase errors between the approximated zero-crossing points and the corresponding zero-crossing points of the signal under measurement from the approximated zero-crossing complex data sequence.

22. The method of measuring a jitter of a signal under measurement according to claim 17 or 18 wherein said step of estimating the period jitter sequence comprising:

a step of obtaining an instantaneous period sequence of the signal under measurement from intervals between the approximated zero-crossing points and from the zero-crossing phase error data;

a step of calculating differences between the instantaneous periods and the fundamental period of the signal under measurement, and obtaining an uncorrected period jitter sequence; and a step of multiplying the uncorrected period jitter sequence by a ratio of the fundamental period of the signal under measurement and the intervals between the approximated zero-crossing points to correct the uncorrected period jitter sequence.

23. The method of measuring a jitter of a signal under measurement according to claim 17 or 18 wherein said step of obtaining the period jitter sequence comprising:

a step of obtaining an instantaneous angular frequency sequence of the signal under measurement from intervals of the approximated zero-crossing points and from the zero-crossing phase error data; and a step of obtaining a period jitter sequence from the instantaneous angular frequency sequence and the fundamental period of the signal under measurement.

24. The method of measuring a jitter of a signal under measurement according to claim 17 or 18 wherein said step of band-limiting the signal under measurement comprising:

a step of transforming the signal under measurement into a spectrum signal in frequency domain;

a step of extracting only components around a fundamental frequency of the spectrum signal; and a step of inverse-transforming the spectrum signal having only the fundamental frequency component into a signal in time domain.

25. The method of measuring a jitter of a signal under measurement according to claim 17 or 18 wherein said step of band-limiting the signal under measurement comprising:

a step of storing the signal under measurement in a buffer memory;

a step of extracting the signal in the sequential order from the buffer memory as a partial signal such that each partial signal being extracted is partially overlapped with the partial signal extracted just before;

a step of multiplying each extracted partial signal by a window function;

a step of transforming each partial signal multiplied by the window function into a spectrum signal in frequency domain;

a step of extracting only components around a fundamental frequency of the signal under measurement from the spectrum signal;

a step of inverse-transforming the spectrum signal having only the fundamental frequency component into a signal in time domain; and a step of multiplying the inverse-transformed signal in time domain by an inverse number of the window function to obtain the band-limited signal.

26. The method of measuring a jitter of a signal under measurement according to claim 17 or 18 further including a step of performing a waveform clipping of the signal under measurement to remove amplitude modulation components of the signal under measurement in the state that phase modulation components of the signal under measurement are retained.

27. The method of measuring a jitter of a signal under measurement according to claim 17 or 18 further including a step of obtaining a fundamental period of the signal under measurement.

28. The method of measuring a jitter of a signal under measurement according to claim 19 wherein said step of obtaining the jitter value is a step of obtaining a difference between the maximum value and the minimum value of the jitter sequence, and calculating a peak-to-peak value.

29. The method of measuring a jitter of a signal under measurement according to claim 19 wherein said step of obtaining the jitter value is a step of obtaining a root-mean-square value of the jitter sequence, and calculating an RMS value.

30. The method of measuring a jitter of a signal under measurement according to claim 19 wherein said step of obtaining the jitter value is a step of obtaining a histogram data of the jitter sequence.

31. The method of measuring a jitter of a signal under measurement according to claim 22 wherein said step of estimating the period jitter further including a step of removing high frequency components in the period jitter sequence.

* * * * *